US011340273B2

(12) United States Patent
Akai et al.

(10) Patent No.: US 11,340,273 B2
(45) Date of Patent: May 24, 2022

(54) PRESENCE-IN-HOUSE DETERMINATION SYSTEM AND PRESENCE-IN-HOUSE DETERMINATION METHOD

(71) Applicant: HITACHI, LTD., Tokyo (JP)

(72) Inventors: Akihito Akai, Tokyo (JP); Tomoya Fujiwara, Tokyo (JP); Yoshihiro Machida, Tokyo (JP); Yoshiki Matsuura, Tokyo (JP)

(73) Assignee: HITACHI, LTD., Tokyo (JP)

( * ) Notice: Subject to any disclaimer, the term of this patent is extended or adjusted under 35 U.S.C. 154(b) by 400 days.

(21) Appl. No.: 16/495,453

(22) PCT Filed: Apr. 2, 2018

(86) PCT No.: PCT/JP2018/014061
§ 371 (c)(1),
(2) Date: Sep. 19, 2019

(87) PCT Pub. No.: WO2018/193820
PCT Pub. Date: Oct. 25, 2018

(65) Prior Publication Data

US 2020/0072881 A1 Mar. 5, 2020

(30) Foreign Application Priority Data

Apr. 21, 2017 (JP) ............................ JP2017-084337

(51) Int. Cl.
*G01R 21/133* (2006.01)

(52) U.S. Cl.
CPC .................................. *G01R 21/133* (2013.01)

(58) Field of Classification Search
CPC .............................. G01R 21/133; G06Q 50/06
See application file for complete search history.

(56) References Cited

U.S. PATENT DOCUMENTS

2014/0180968 A1* 6/2014 Song ...................... G06Q 50/06 705/412
2017/0092102 A1* 3/2017 Fusakawa ............. G06Q 10/06
(Continued)

FOREIGN PATENT DOCUMENTS

CA 2713702 C * 3/2018 ............. G01R 21/00
EP 3279839 A1 * 2/2018 .............. B60L 53/51
(Continued)

OTHER PUBLICATIONS

International Search Report of PCT/JP2018/014061 dated Jul. 3, 2018.

*Primary Examiner* — Manuel A Rivera Vargas
*Assistant Examiner* — Yaritza H Perez Bermudez
(74) *Attorney, Agent, or Firm* — Mattingly & Malur, PC

(57) ABSTRACT

To improve determination accuracy of determining whether a user is present in a house. A presence-in-house determination system 1 includes: a first presence-in-house determination unit 111 configured to determine whether the user is present in the house based on a change over time in electric power consumption of the house of the user; second presence-in-house determination units 112A and 112B configured to determine whether the user is present in the house based on an operation state of at least one of electric appliances 20A and 20B provided in the house; and a comprehensive determination unit 114 configured to determine whether the user is present in the house based on a determination result of the first presence-in-house determination unit and a determination result of the second presence-in-house determination unit.

14 Claims, 20 Drawing Sheets

T4(1)

| | SPRING AND AUTUMN | SUMMER | WINTER |
|---|---|---|---|
| WEEKDAY ABSENCE TYPE | T4(11A) | T4(11B) | T4(11C) |
| HOLIDAY ABSENCE TYPE | T4(21A) | T4(21B) | T4(21C) |
| NIGHT TYPE | T4(31A) | T4(31B) | T4(31C) |
| ... | ... | ... | ... |

T4(2)

| | WEEKDAY ABSENCE TYPE | HOLIDAY ABSENCE TYPE | NIGHT TYPE | ... |
|---|---|---|---|---|
| SINGLE PERSON HOUSEHOLD TYPE | T4(12A) | T4(12B) | T4(12C) | ... |
| COUPLE TYPE | T4(22A) | T4(22B) | T4(22C) | ... |
| COUPLE WITH CHILDREN TYPE | T4(32A) | T4(32B) | T4(32C) | ... |
| ... | ... | ... | ... | ... |

T4(3)

| | SPRING AND AUTUMN | SUMMER | WINTER | ... |
|---|---|---|---|---|
| WEATHER GOOD | T4(13A) | T4(13B) | T4(13C) | ... |
| WEATHER NORMAL | T4(23A) | T4(23B) | T4(23C) | ... |
| WEATHER NOT GOOD | T4(33A) | T4(33B) | T4(33C) | ... |
| ... | ... | ... | ... | ... |

⋮

(56) References Cited

U.S. PATENT DOCUMENTS

| | | | | |
|---|---|---|---|---|
| 2017/0116686 | A1* | 4/2017 | Fujita | G06F 1/3287 |
| 2018/0067593 | A1* | 3/2018 | Tiwari | G08B 13/22 |
| 2021/0185485 | A1* | 6/2021 | Deixler | H04W 64/003 |

FOREIGN PATENT DOCUMENTS

| | | | | |
|---|---|---|---|---|
| EP | 3279855 | A1 * | 2/2018 | G06Q 10/04 |
| JP | 2012-181789 | A | 9/2012 | |
| JP | 2013-213825 | A | 10/2013 | |
| JP | 2016-019334 | A | 2/2016 | |
| JP | 2016-126713 | A | 7/2016 | |
| WO | 2016/038893 | A1 | 3/2016 | |
| WO | WO-2016038893 | A1 * | 3/2016 | G08B 25/00 |
| WO | WO-2020085578 | A1 * | 4/2020 | F24F 11/74 |

* cited by examiner

[Fig. 1]
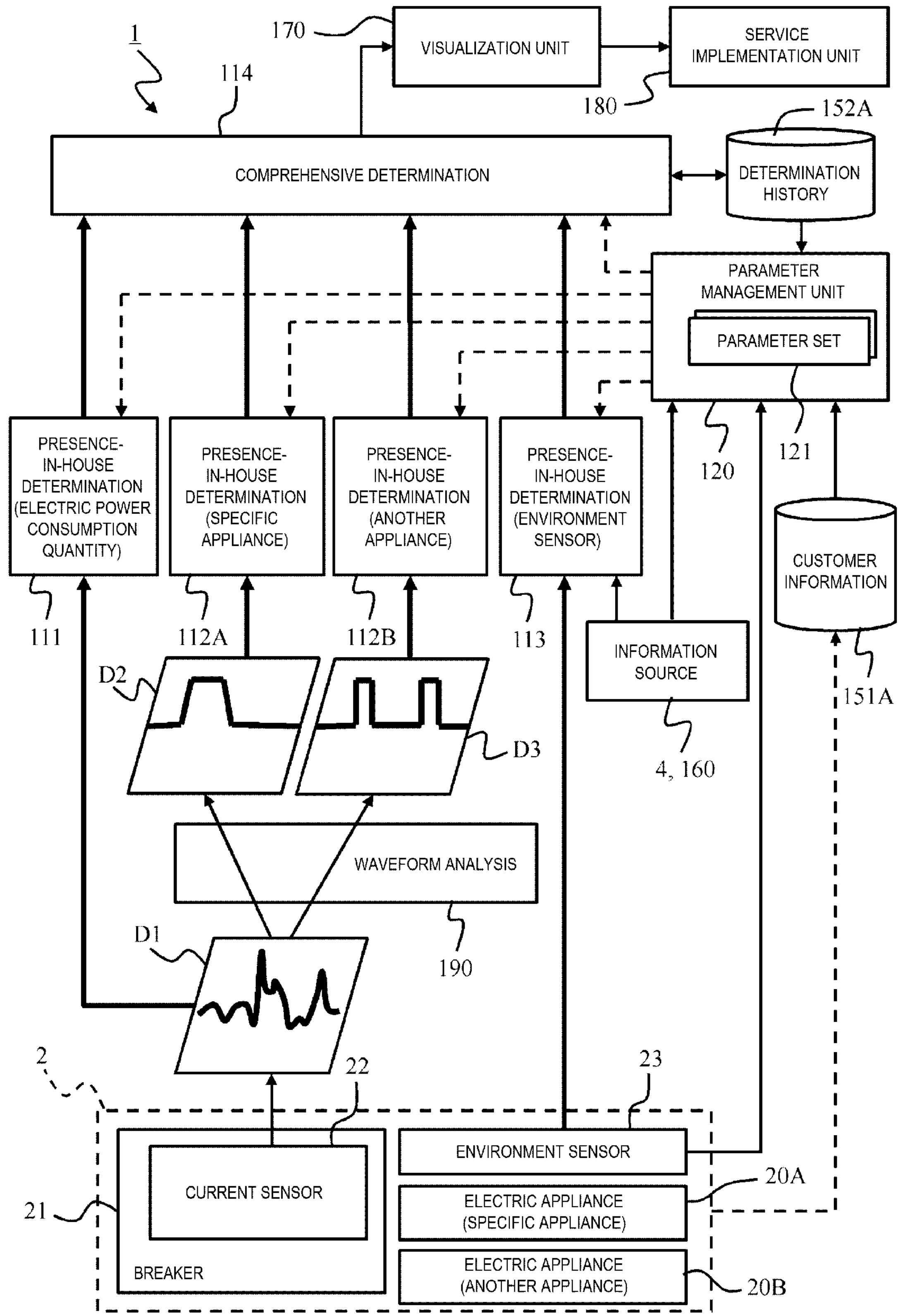

[Fig. 2]
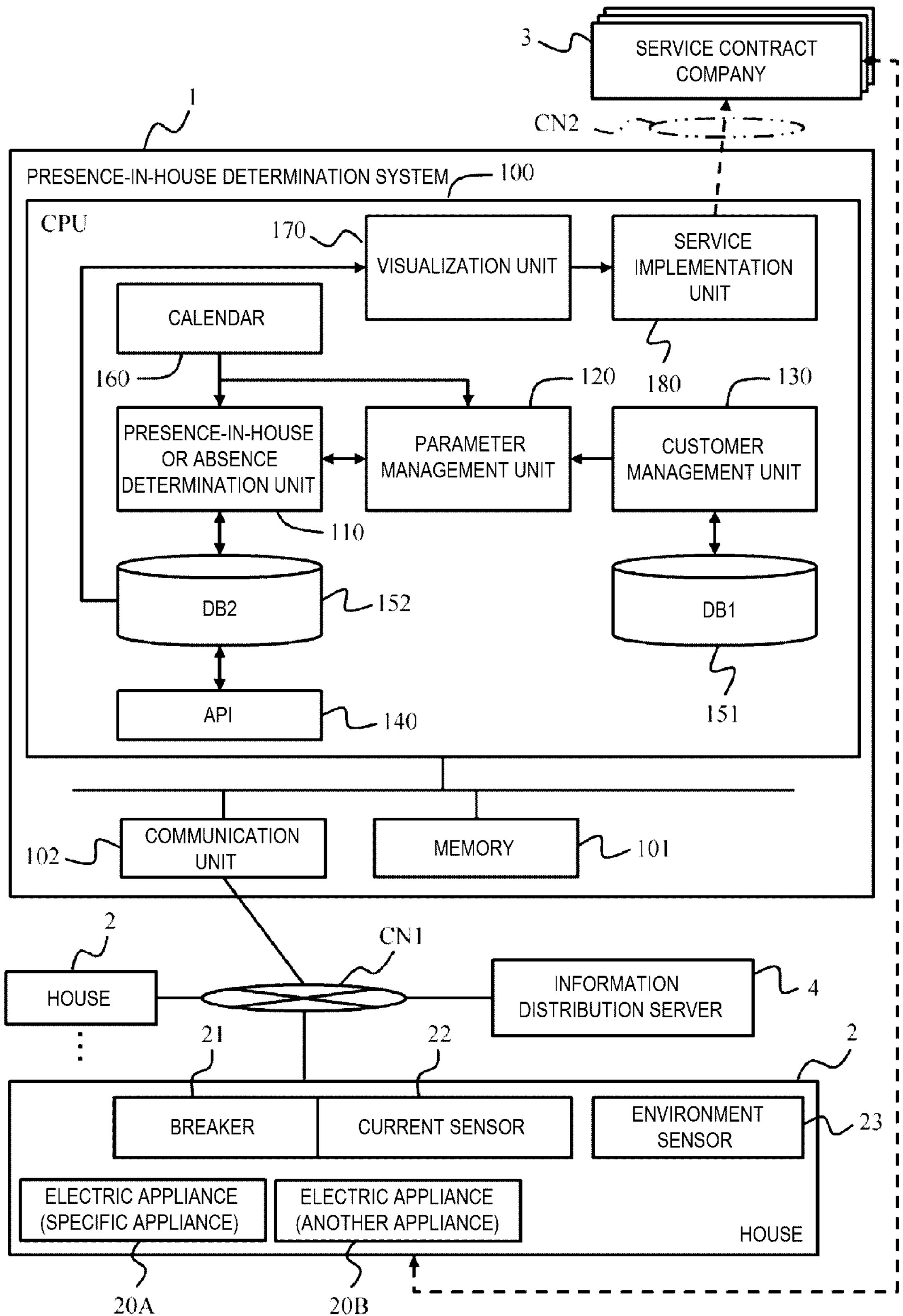

[Fig. 3]
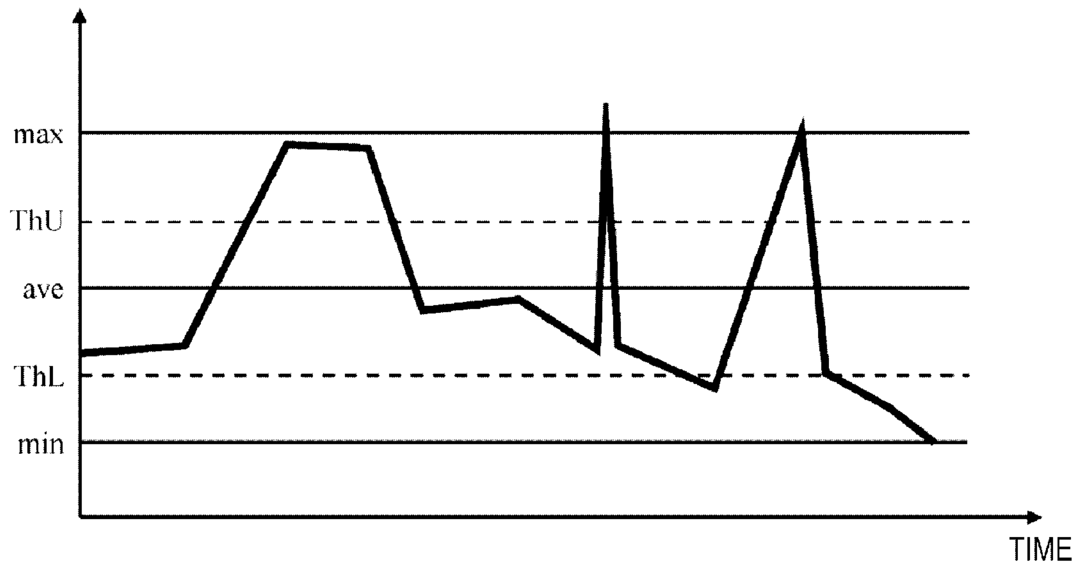
[Fig. 4]
ELECTRIC POWER CONSUMPTION QUANTITY BASED PRESENCE-IN-HOUSE OR ABSENCE DETERMINATION TABLE T1
| # (C11) | CONDITION (C12) | DETERMINATION (C13) |
| --- | --- | --- |
| 1 | ThU<W | ○ |
| 2 | ThL≦W≦ThU | △ |
| 3 | ThL>W | × |

[Fig. 5]

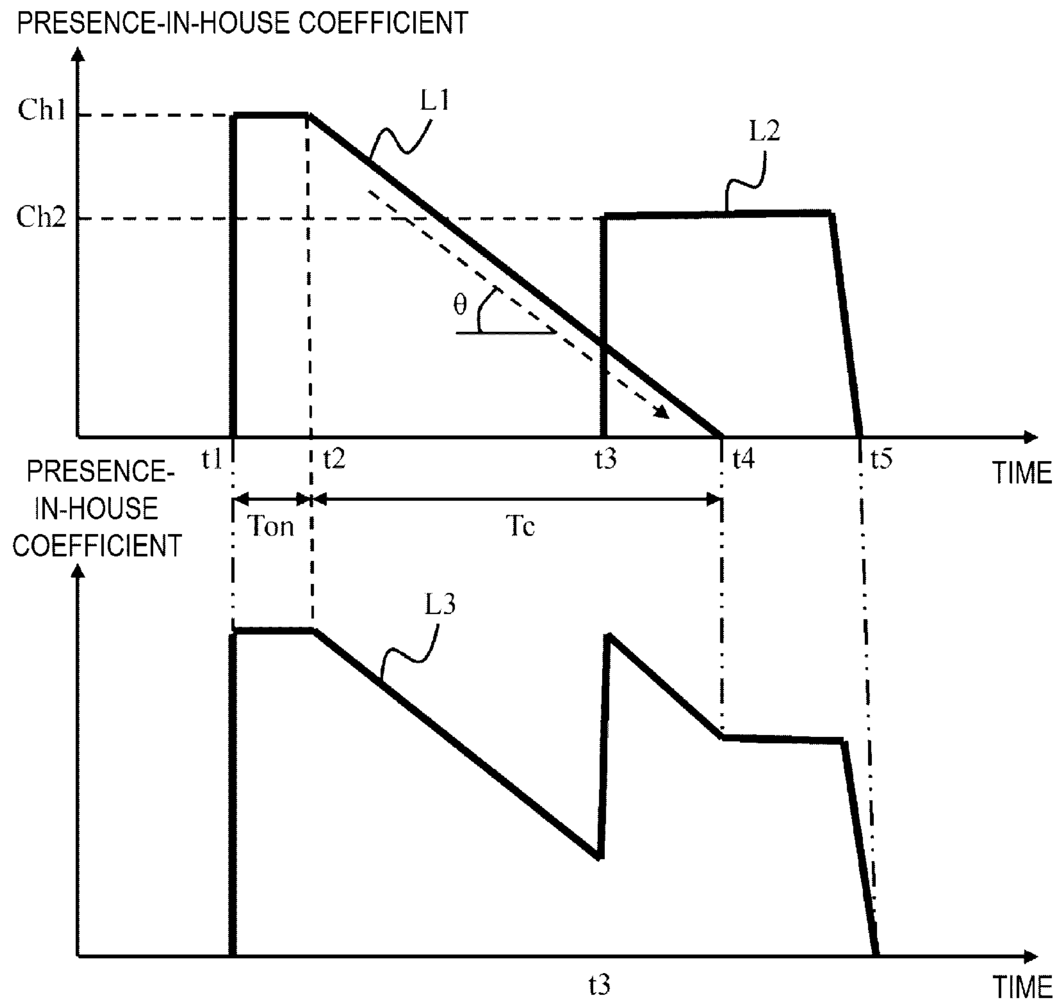

[Fig. 6]

PRESENCE-IN-HOUSE COEFFICIENT BASED PRESENCE-IN-HOUSE OR ABSENCE DETERMINATION TABLE T2

C21 C22 C23

| # | CONDITION | DETERMINATION |
|---|---|---|
| 1 | PRESENCE-IN-HOUSE COEFFICIENT OF SPECIFIC APPLIANCE Ch1 > ThC1 | ○ |
| 2 | TOTAL OF PRESENCE-IN-HOUSE COEFFICIENTS Ch2 OF ANOTHER APPLIANCES > ThC2 | △ |
| 3 | PRESENCE-IN-HOUSE COEFFICIENT OF SPECIFIC APPLIANCE AND PRESENCE-IN-HOUSE COEFFICIENT OF ANOTHER APPLIANCE ≤ ThC2 | × |

[Fig. 7]

APPLIANCE OPERATION TIME MANAGEMENT TABLE T3

C31 C32 C33

| # | TYPE OF APPLIANCE | ESTIMATED OPERATION TIME |
|---|---|---|
| 1 | AIR CONDITIONER | 1 HOUR OR MORE |
| 2 | WASHING MACHINE | 30 MINUTES OR MORE |
| 3 | MICROWAVE OVEN | 1 MINUTE TO 1 HOUR |
| 4 | REFRIGERATOR | OPERATES CONSTANTLY |
| 5 | RICE COOKER | 30 MINUTES TO 1 HOUR |
| 6 | TELEVISION | 5 MINUTES OR MORE |
| 7 | CLEANER | 5 MINUTES TO 30 MINUTES |
| 8 | IH COOKING HEATER | 3 MINUTES TO 3 HOURS |
| 9 | ELECTRIC POT | 5 MINUTES TO 30 MINUTES |
| 10 | ELECTRIC STOVE | 5 MINUTES OR MORE |
| 11 | NOT DETERMINED | |
| ... | ... | ... |

[Fig. 8]

PARAMETER MANAGEMENT TABLE T4

| TYPE OF APPLIANCE (C41) | PARAMETER 1 (PRESENCE-IN-HOUSE COEFFICIENT) (C42) | PARAMETER 2 (TRANSITION TIME) (C43) |
|---|---|---|
| AIR CONDITIONER | 0.1 | 120 MINUTES |
| WASHING MACHINE | 0.2 | 60 MINUTES |
| RICE COOKER | 0.2 | 180 MINUTES |
| TELEVISION | 0.2 | 30 MINUTES |
| CLEANER | 0.3 | 60 MINUTES |
| ... | ... | ... |

| | SPRING AND AUTUMN | SUMMER | WINTER |
|---|---|---|---|
| WEEKDAY ABSENCE TYPE | T4(11A) | T4(11B) | T4(11C) |
| HOLIDAY ABSENCE TYPE | T4(21A) | T4(21B) | T4(21C) |
| NIGHT TYPE | T4(31A) | T4(31B) | T4(31C) |
| ... | ... | ... | ... |

T4(2)

| | WEEKDAY ABSENCE TYPE | HOLIDAY ABSENCE TYPE | NIGHT TYPE | ... |
|---|---|---|---|---|
| SINGLE PERSON HOUSEHOLD TYPE | T4(12A) | T4(12B) | T4(12C) | ... |
| COUPLE TYPE | T4(22A) | T4(22B) | T4(22C) | ... |
| COUPLE WITH CHILDREN TYPE | T4(32A) | T4(32B) | T4(32C) | ... |
| ... | ... | ... | ... | ... |

T4(3)

| | SPRING AND AUTUMN | SUMMER | WINTER | ... |
|---|---|---|---|---|
| WEATHER GOOD | T4(13A) | T4(13B) | T4(13C) | ... |
| WEATHER NORMAL | T4(23A) | T4(23B) | T4(23C) | ... |
| WEATHER NOT GOOD | T4(33A) | T4(33B) | T4(33C) | ... |
| ... | ... | ... | ... | ... |

⋮

[Fig. 10]
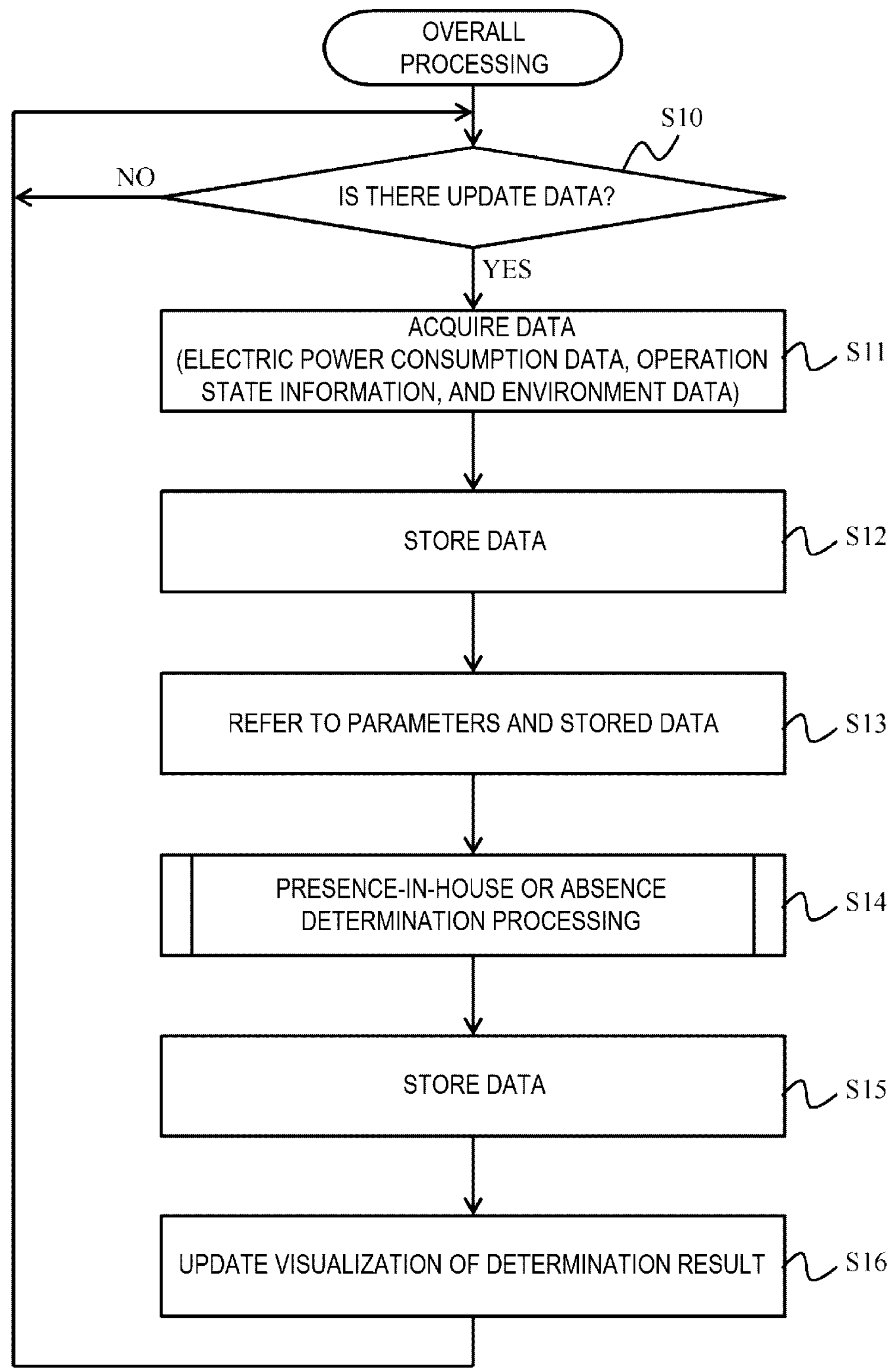

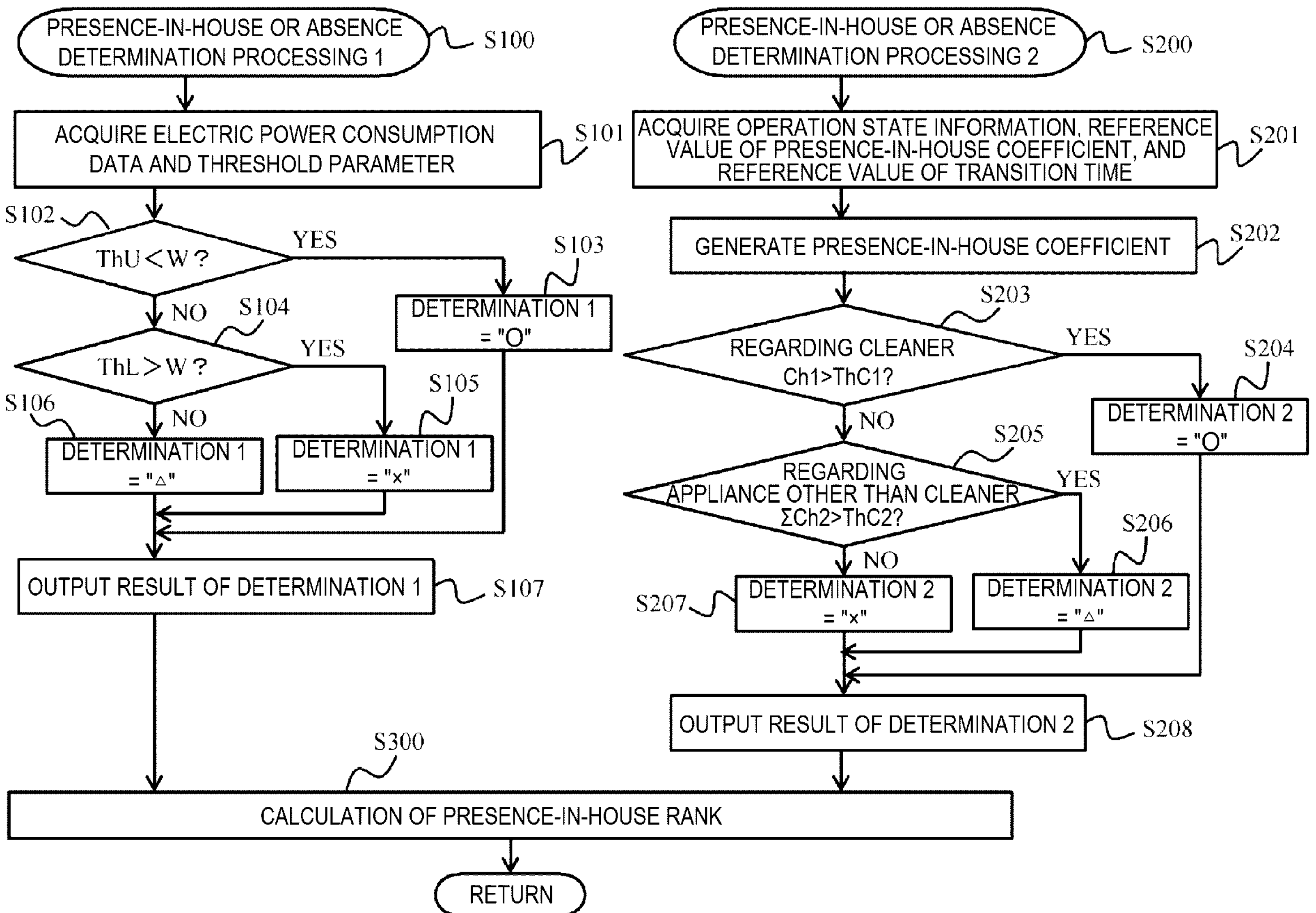
[Fig. 11]
PRESENCE-IN-HOUSE OR ABSENCE DETERMINATION PROCESSING 1
S100
ACQUIRE ELECTRIC POWER CONSUMPTION DATA AND THRESHOLD PARAMETER
S101
S102
ThU < W ?
YES
NO
S103
DETERMINATION 1 = "O"
S104
ThL > W ?
YES
NO
S105
DETERMINATION 1 = "x"
S106
DETERMINATION 1 = "Δ"
OUTPUT RESULT OF DETERMINATION 1
S107
PRESENCE-IN-HOUSE OR ABSENCE DETERMINATION PROCESSING 2
S200
ACQUIRE OPERATION STATE INFORMATION, REFERENCE VALUE OF PRESENCE-IN-HOUSE COEFFICIENT, AND REFERENCE VALUE OF TRANSITION TIME
S201
GENERATE PRESENCE-IN-HOUSE COEFFICIENT
S202
S203
REGARDING CLEANER Ch1>ThC1?
YES
NO
S204
DETERMINATION 2 = "O"
S205
REGARDING APPLIANCE OTHER THAN CLEANER ΣCh2>ThC2?
YES
NO
S206
DETERMINATION 2 = "Δ"
S207
DETERMINATION 2 = "x"
OUTPUT RESULT OF DETERMINATION 2
S208
S300
CALCULATION OF PRESENCE-IN-HOUSE RANK
RETURN

[Fig. 12]

PRESENCE-IN-HOUSE RANK DETERMINATION TABLE T5

| # (C51) | DETERMINATION RESULT OF ELECTRIC POWER CONSUMPTION QUANTITY (C52) | DETERMINATION RESULT OF PRESENCE-IN-HOUSE EFFICIENT (C53) | PRESENCE-IN-HOUSE RANK (C54) |
|---|---|---|---|
| 1 | ○ | ○ | 5 |
| 2 | ○ | △ | 3 |
| 3 | ○ | × | 2 |
| 4 | △ | ○ | 4 |
| 5 | △ | △ | 2 |
| 6 | △ | × | 1 |
| 7 | × | ○ | 4 |
| 8 | × | △ | 1 |
| 9 | × | × | 0 |

[Fig. 13]

PRESENCE-IN-HOUSE RANK DETERMINATION TABLE T6

| # (C61) | DETERMINATION RESULT OF ELECTRIC POWER CONSUMPTION QUANTITY (C62) | DETERMINATION RESULT OF PRESENCE-IN-HOUSE EFFICIENT (C63) | PREDICTION (C64) | PRESENCE-IN-HOUSE RANK (C65) |
|---|---|---|---|---|
| 1 | ○ | ○ | — | 5 |
| 2 | ○ | △ | — | 3 |
| 3 | ○ | × | — | 2 |
| 4 | △ | ○ | — | 4 |
| 5 | △ | △ | ○ | 3 |
| 6 | △ | △ | × | 2 |
| 7 | △ | × | ○ | 2 |
| 8 | △ | × | × | 1 |
| 9 | × | ○ | — | 4 |
| 10 | × | △ | ○ | 2 |
| 11 | × | △ | × | 1 |
| 12 | × | × | — | 0 |
| ... | ... | ... | ... | ... |

[Fig. 14]

ENVIRONMENT DATA DEFINITION TABLE T7

C71 C72 C73

| # | ITEM | CONTENTS |
|---|---|---|
| 1 | TEMPERATURE | ACQUIRE ROOM TEMPERATURE(S) AT ONE OR MORE PLACES AND OUTSIDE AIR TEMPERATURE |
| 2 | HUMIDITY | ACQUIRE HUMIDITY AT ONE OR MORE PLACES |
| 3 | ILLUMINANCE | ACQUIRE ILLUMINANCE AT ONE OR MORE PLACES |
| 4 | CONCENTRATION OF $CO_2$ | ACQUIRE CONCENTRATION(S) OF $CO_2$ AT ONE OR MORE PLACES |
| 5 | SOUND | ACQUIRE SOUND AND SOUND PRESSURE AT ONE OR MORE PLACES |
| 6 | HUMAN PRESENCE (INFRARED RAYS) | ACQUIRE PRESENCE OR ABSENCE OF HUMAN PRESENCE AT ONE OR MORE PLACES |
| ... | ... | ... |

[Fig. 15]
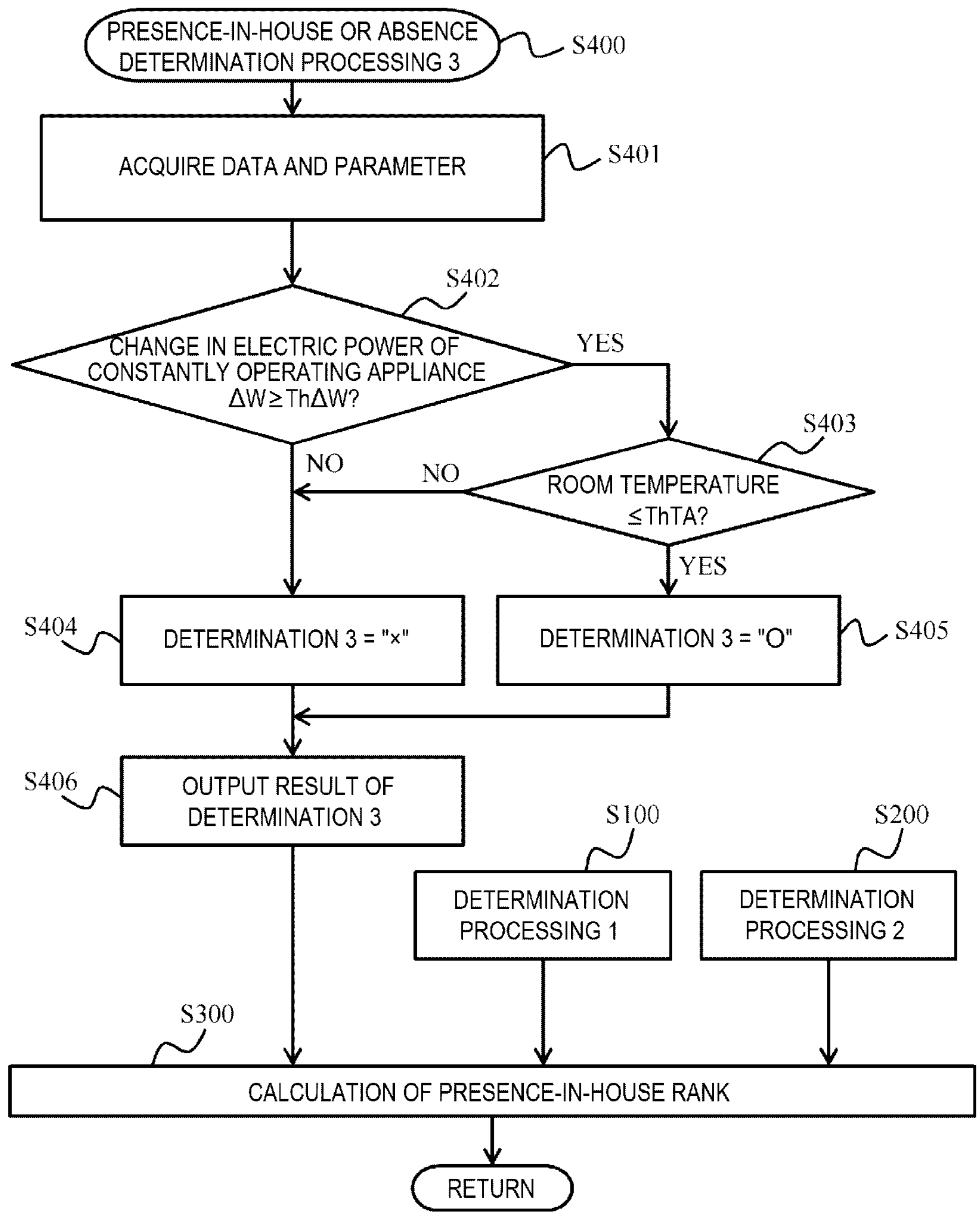

[Fig. 16]
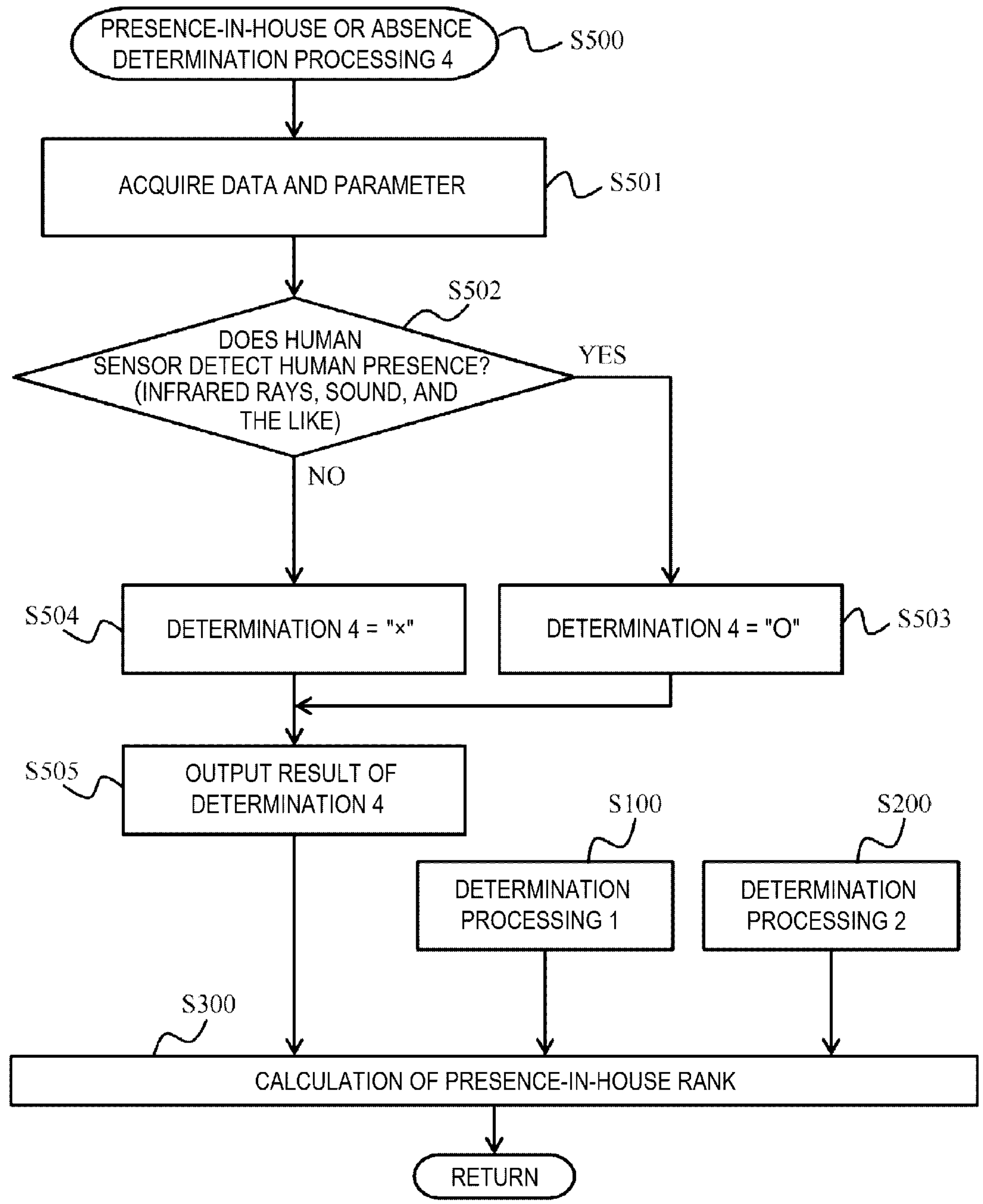

[Fig. 17]
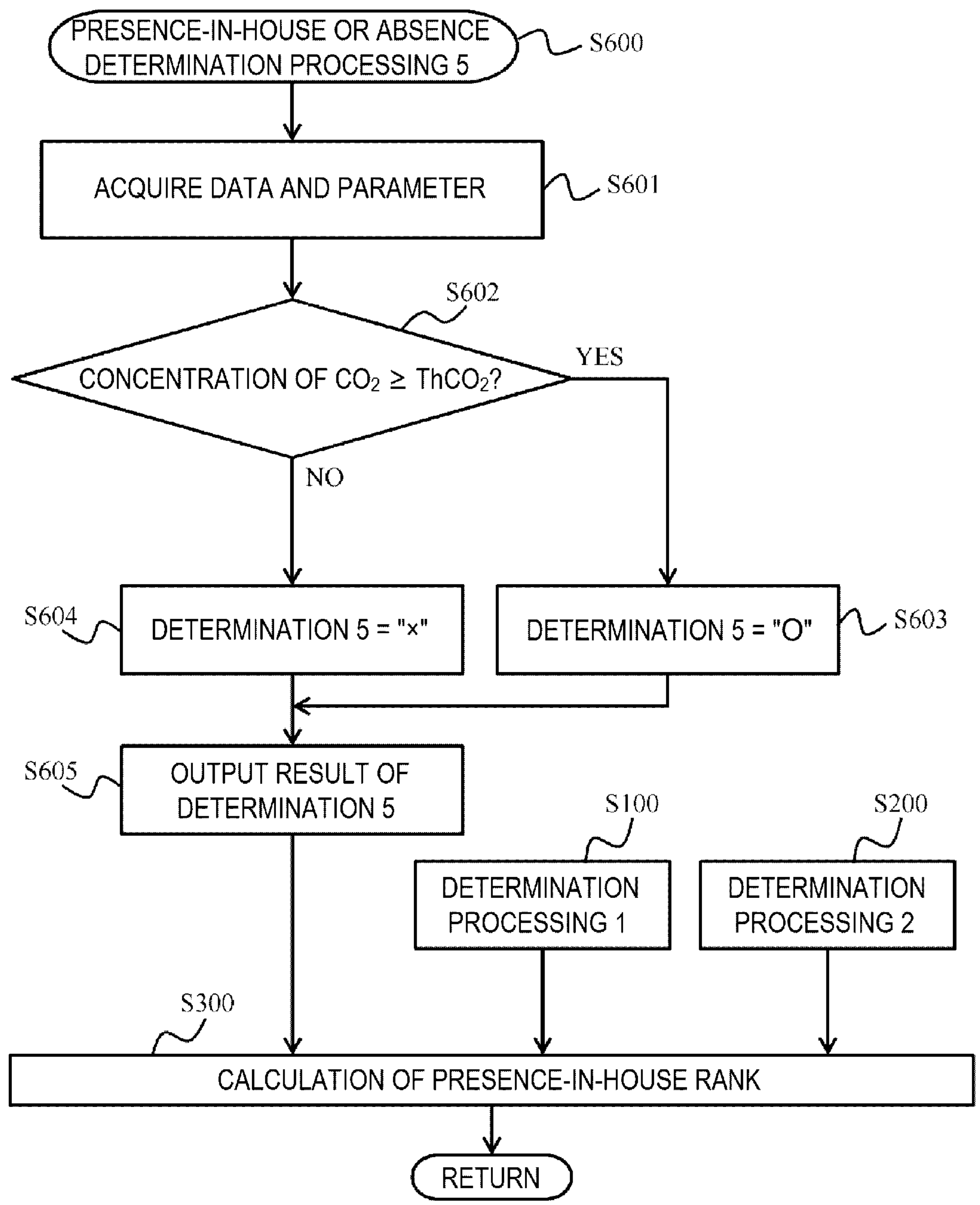

[Fig. 18]
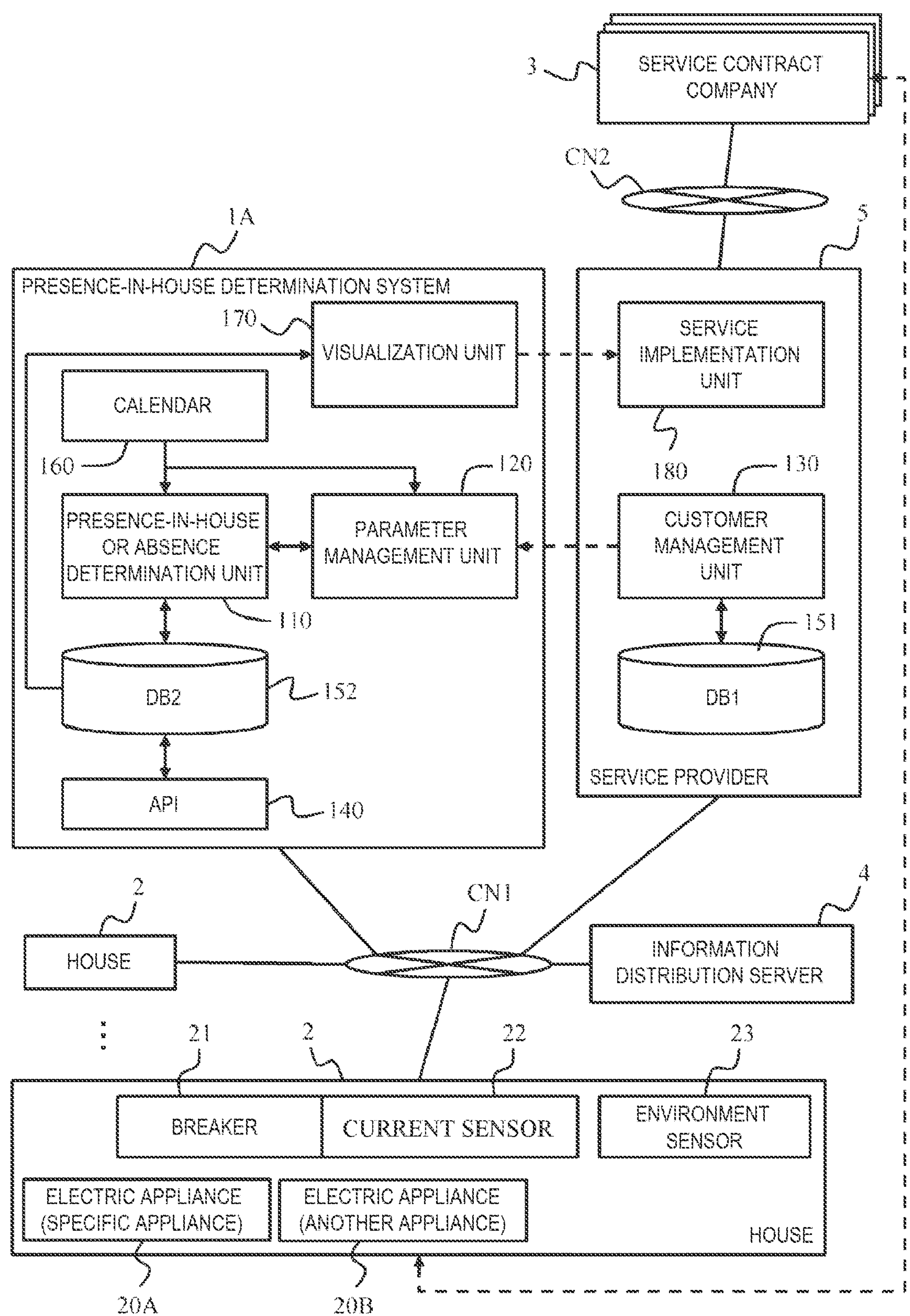

[Fig. 19]
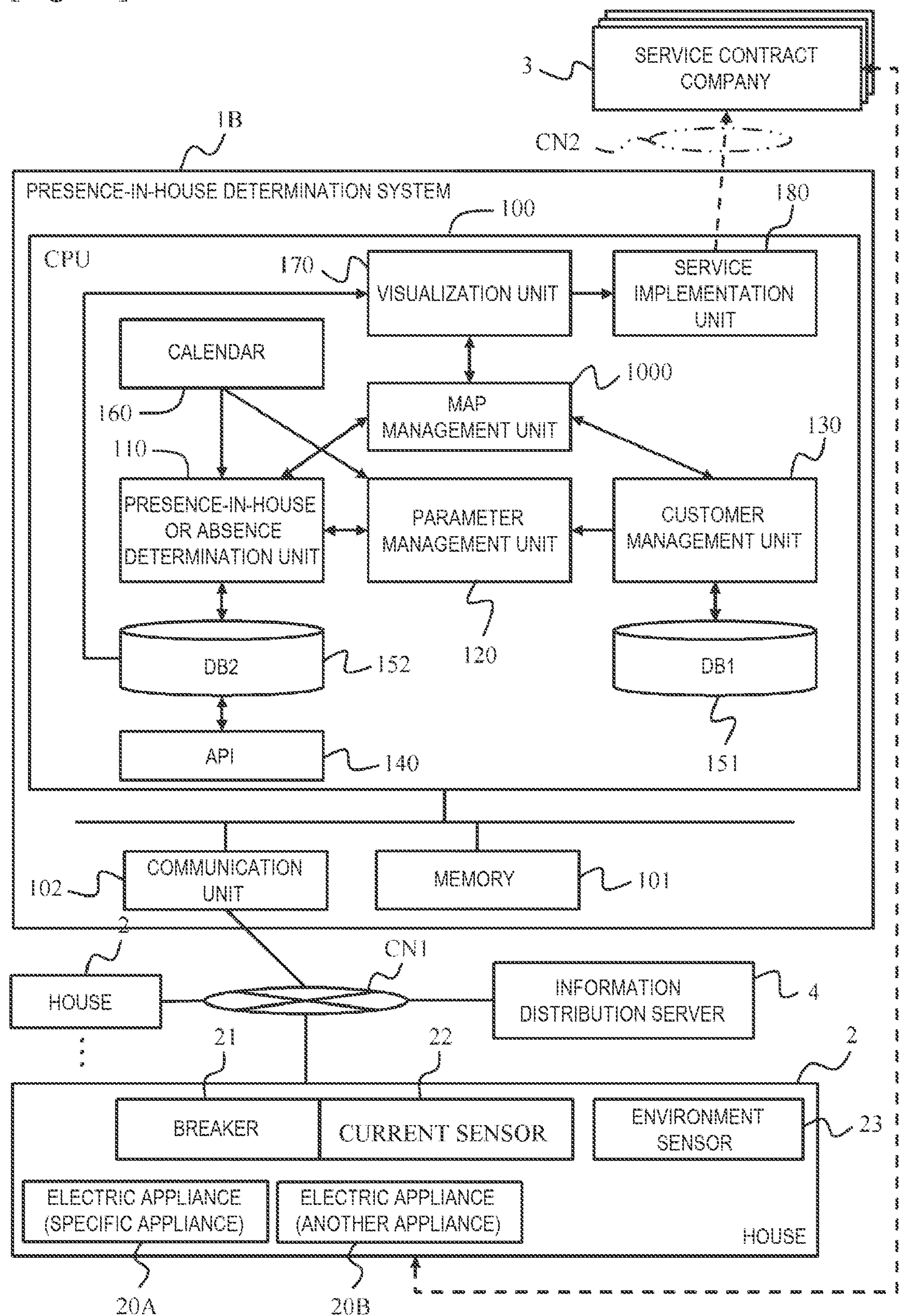

[Fig. 20]
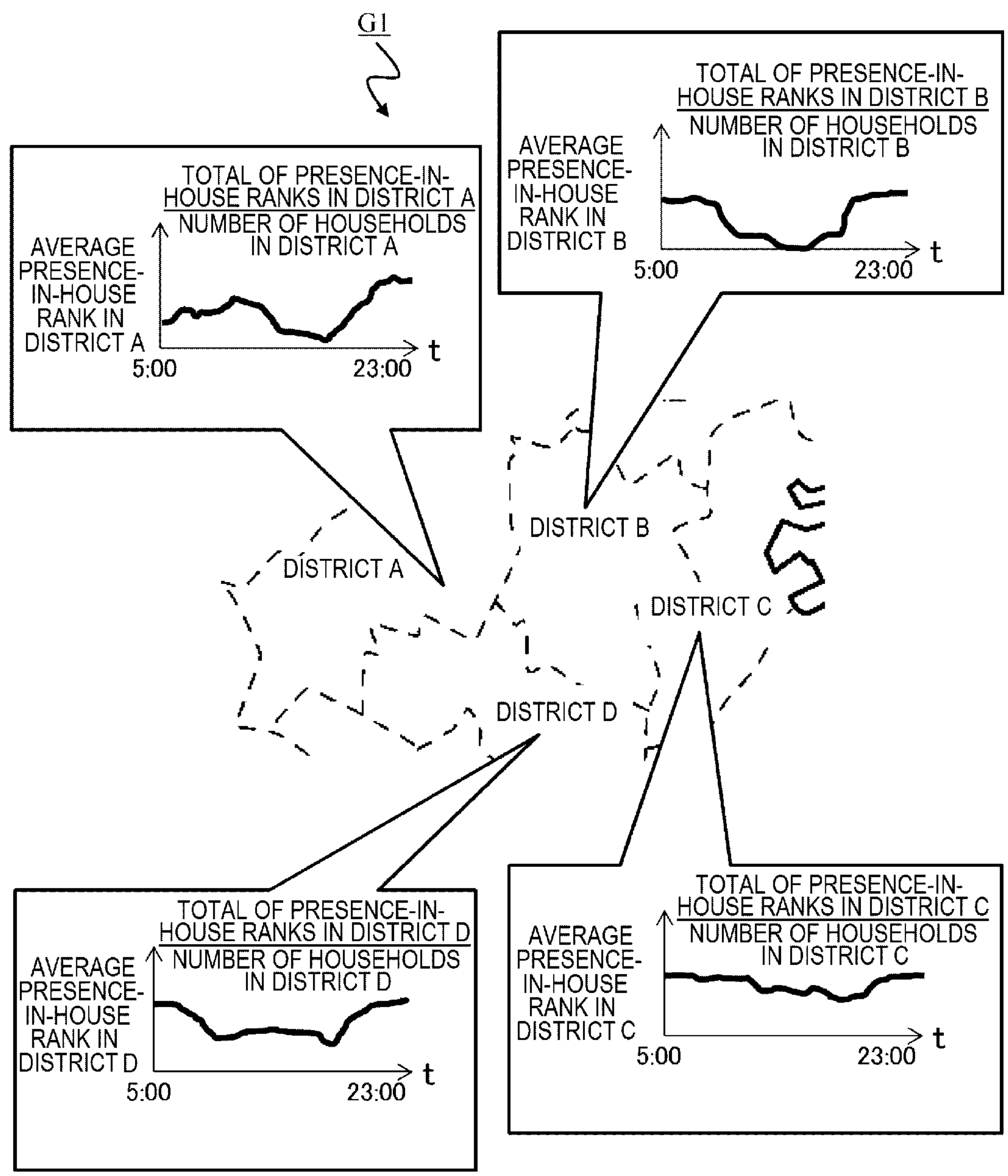

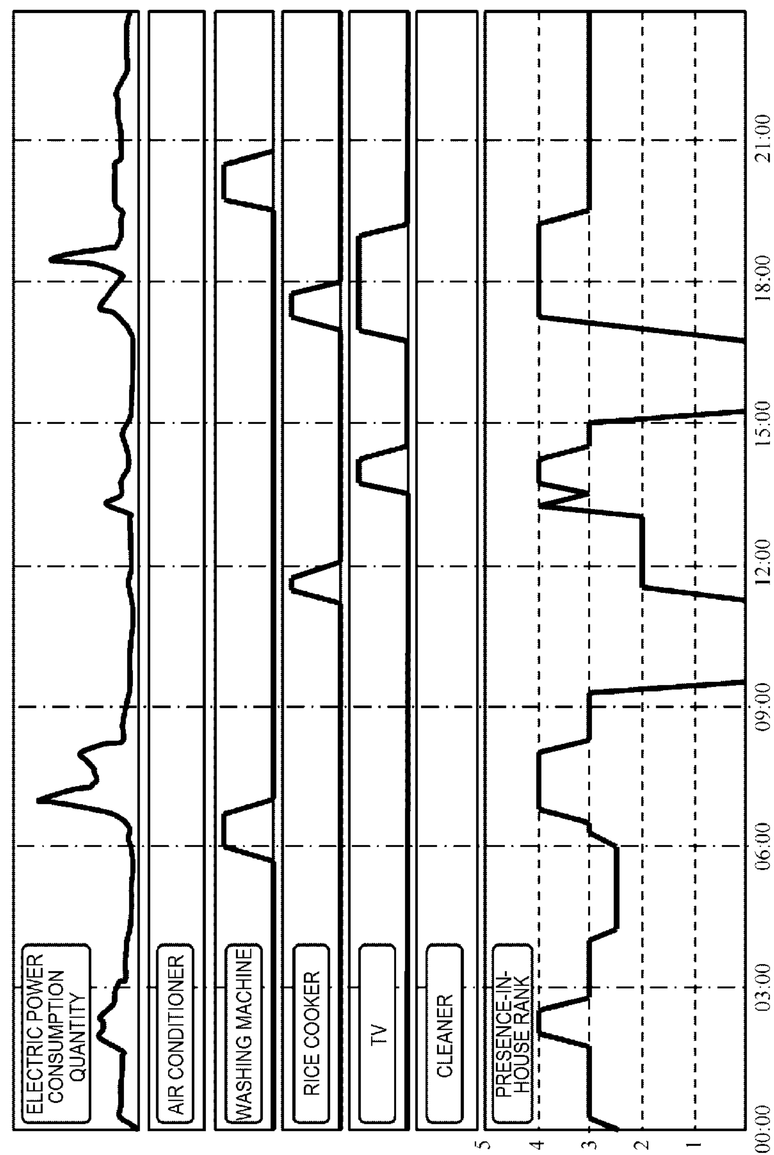
[Fig. 21]

[Fig. 22]
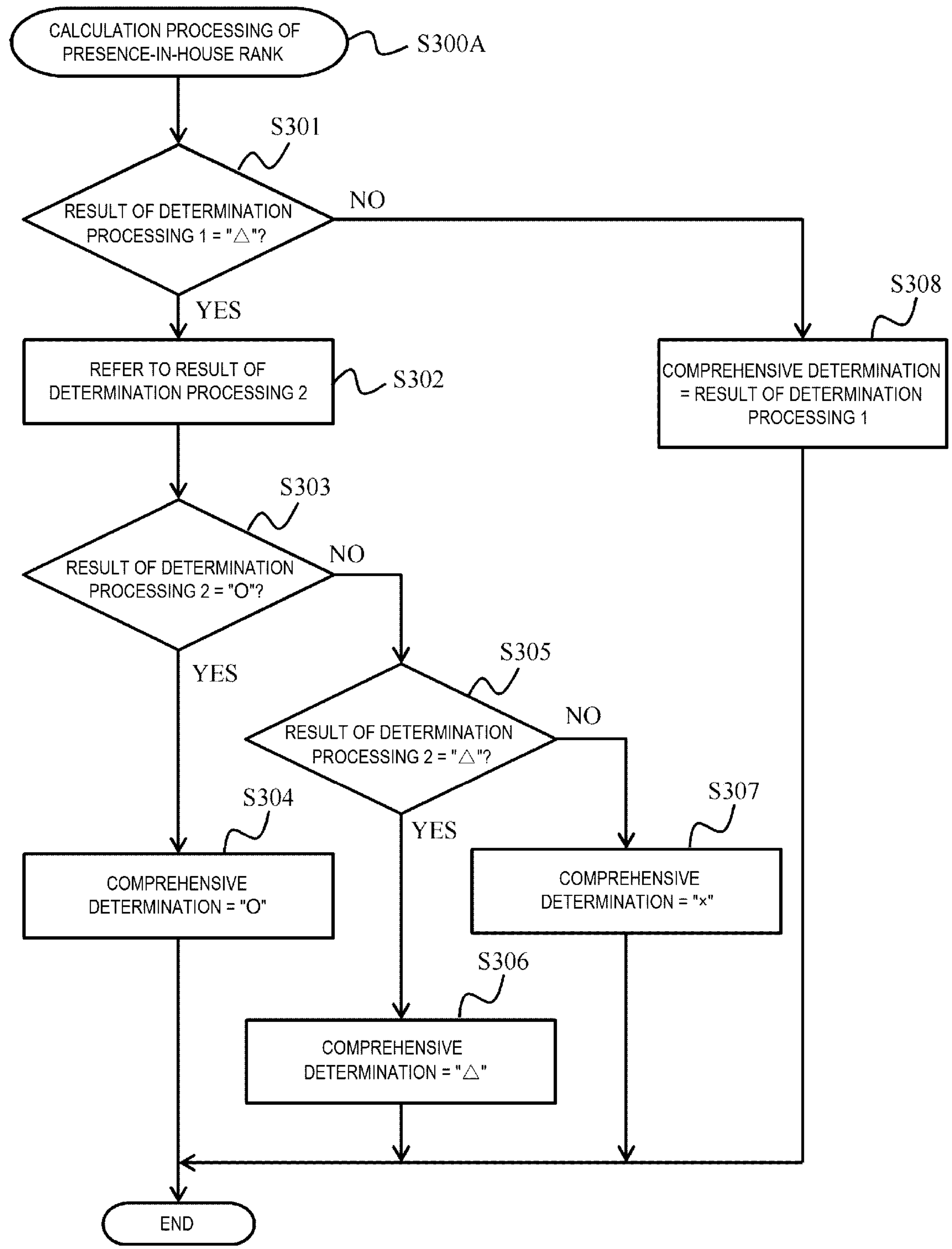

PRESENCE-IN-HOUSE DETERMINATION SYSTEM AND PRESENCE-IN-HOUSE DETERMINATION METHOD

TECHNICAL FIELD

The present invention relates to a presence-in-house determination system and a presence-in-house determination method.

BACKGROUND ART

In a case of a delivery provider, for example, when a receiver is absent, it is necessary to redelivery, thus resulting in an increase in a cost required for the redelivery. When a visitor such as an investigator or a salesperson is absent, visit efficiency is reduced. Further, in recent years, the society has been demanding to know a presence-in-house state of an elderly person who lives alone.

On the other hand, a smart meter is introduced to each house, and an electric power company can acquire electric power consumption quantity information on each house. There is a technology for determining whether there is a presence-in-house situation based on the electric power consumption quantity information on the house (PTL 1 to PTL 3).

In PTL 1, a server of an electric power company calculates information indicating a presence-in-house state by using information on an electric power usage quantity detected by an automatic meter reading system. The server of the electric power company processes the information indicating the presence-in-house state into a presence-in-house probability at a specified future time by taking behavioral characteristics of each house into consideration based on past electric power usage quantity information. The presence-in-house probability information is provided to a service user.

PTL 2 discloses a presence-in-house determination apparatus that determines whether a user is present in a house or absent based on a comparison between a current electric power usage state and a past electric power usage state in a house of the user.

In PTL 3, a current waveform of a breaker disposed in each house is analyzed to estimate operation states of household electric appliances in a house. In PTL 3, it is possible to estimate the operation states of the household electric appliances in the house at low a cost without disposing a sensor for determining whether the household electric appliances in the house are operating.

PRIOR ART LITERATURE

Patent Literature

PTL 1: JP-A-2012-181789
PTL 2: JP-A-2016-126713
PTL 3: JP-A-2013-213825

SUMMARY OF INVENTION

Technical Problem

PTL 1 and PTL 2 both determine whether there is a presence-in-house situation or an absent situation based on electric power consumption data acquired from a sensor. However, for example, when a season is different, a usage frequency of a household electric product (household electric appliance) and a set temperature of an air conditioner are changed. If a room temperature is different, a load state of a refrigerator changes. That is, it is difficult to keep constant accuracy of determination on whether there is the presence-in-house situation or the absent situation by using the same determination processing throughout one year.

PTL 3 is limited to estimating the operation states of the household electric appliances in the house and does not disclose the technology for determining whether the house is in the presence-in-house situation or the absent situation.

The invention has been made in view of the above problems, and an object of the invention is to provide a presence-in-house determination system and a presence-in-house determination method that can improve accuracy of determining whether a user is present in house by combining a plurality of determination methods.

Solution to Problem

In order to solve the above problems, one aspect of the invention provides a presence-in-house determination system that determines whether a user is present in a house, the presence-in-house determination system including: a first presence-in-house determination unit configured to determine whether the user is present in the house based on a change over time in electric power consumption of the house of the user; a second presence-in-house determination unit configured to determine whether the user is present in the house based on an operation state of at least one electric appliance provided in the house; and a comprehensive determination unit configured to determine whether the user is present in the house based on a determination result of the first presence-in-house determination unit and a determination result of the second presence-in-house determination unit.

Advantageous Effect

According to the invention, determination accuracy is improved because whether a user is present in a house can be determined based on a determination result of a first presence-in-house determination unit that determines whether there is a presence-in-house situation from a change over time in electric power consumption of the house, and a determination result of a second presence-in-house determination unit that determines whether there is presence-in-house situation from an operation state of at least one electric appliance provided in the house.

BRIEF DESCRIPTION OF DRAWINGS

FIG. 1 is an explanatory diagram showing an overall outline of a presence-in-house determination system according to the present embodiment.

FIG. 2 is a block diagram showing a functional configuration of the presence-in-house determination system.

FIG. 3 is a graph showing a relationship between a change over time in an electric power consumption quantity of a house and a threshold for determining whether there is a presence-in-house situation.

FIG. 4 is an example of a table of determining a presence-in-house or absence situation based on the electric power consumption quantity.

FIG. 5 is a graph showing a change over time in presence-in-house coefficients set in accordance with characteristics of electric appliances.

FIG. 6 is an example of a table of determining the presence-in-house or absence situation based on a presence-in-house coefficient of an electric appliance.

FIG. 7 is an example of a table of storing assumed operation times of electric appliances.

FIG. 8 is an example of a table of managing weighting parameters of each electric appliance.

FIG. 9 is an example of a weighting parameter management table prepared from a plurality of viewpoints.

FIG. 10 is a flowchart of an overall processing executed by the presence-in-house determination system.

FIG. 11 is a flowchart showing details of a presence-in-house or absence determination processing of FIG. 10.

FIG. 12 is an example of a presence-in-house rank determination table of ranking presence-in-house possibilities.

FIG. 13 is an example of a presence-in-house rank determination table in which past presence-in-house determination results are also considered.

FIG. 14 is an example of a table of defining house environment data of a house according to a second embodiment.

FIG. 15 is a flowchart showing an example of presence-in-house or absence determination processing.

FIG. 16 is a flowchart showing another example of the presence-in-house or absence determination processing.

FIG. 17 is a flowchart showing still another example of the presence-in-house or absence determination processing.

FIG. 18 is a functional block diagram of a presence-in-house determination system according to a third embodiment.

FIG. 19 is a functional block diagram of a presence-in-house determination system according to a fourth embodiment.

FIG. 20 is an example of a screen that displays a presence-in-house or absence determination result statistically processed for each region.

FIG. 21 is an example of a screen that displays a presence-in-house rank for each user.

FIG. 22 is a flowchart of a presence-in-house rank calculation processing according to a fifth embodiment.

Description of Embodiments

Embodiments of the invention will be described below with reference to the accompanying drawings. In a presence-in-house or absent determination processing according to the present embodiment, whether a user is present in a house is determined based on a change over time in an electric power consumption quantity and an operation state of an electric appliance in a manner that the user is unaware of the determination as much as possible. Contents, thresholds, and the like of each table described below can be variably set.

FIG. 1 shows an overall outline of a presence-in-house determination system 1 according to the present embodiment. The presence-in-house determination system 1 is communicably connected to a house 2 of the user, that is, a household consumer 2. The presence-in-house determination system 1 is also communicably connected to a computer system 3 of a service contract company and an information distribution server 4 (both see FIG. 2). On the drawing, the description of "unit" may be omitted so that a "comprehensive determination unit" is indicated as "comprehensive determination".

The presence-in-house determination system 1 appropriately combines a plurality of presence-in-house determination units 112A, 112B, and 113 in different determination methods, thereby determining whether the house 2 of the user is in a presence-in-house state. A comprehensive determination unit 114 determines presence-in-house possibilities of the user in consideration of respective determination results of a presence-in-house determination unit 111 for an electric power consumption quantity, the presence-in-house determination unit 112A for a specific appliance, the presence-in-house determination unit 112B for another appliance, and the presence-in-house determination unit 113 for an environment sensor. A presence-in-house or absence determination unit 110 shown in FIG. 2 includes the respective determination units 111, 112A, 112B, 113, and 114. In embodiments described below, a processing performed by the presence-in-house determination unit 111 for the electric power consumption quantity is referred to as a first determination processing, and a processing performed by the presence-in-house determination unit 112A for the specific appliance and the presence-in-house determination unit 112B for another appliance is referred to as a second determination processing.

The presence-in-house determination unit 111 for the electric power consumption quantity serving as a "first presence-in-house determination unit" determines whether the user is present in the house or absent based on a change over time in an electric power consumption quantity of the house 2 of the user. A change over time D1 in the electric power consumption quantity of the house 2 can be acquired from a detection signal of a current sensor 22 provided in a breaker 21 of the house 2. The current sensor 22 dose not directly measure a value of an electric current that flows through each electric appliance 20 in the house 2, but measures a basis electric current value, which is a total of electric current consumption of all the electric appliances 20, and transmits the measured current value to the presence-in-house determination system 1.

A waveform analysis unit 190 analyzes the change over time D1 in an electric power consumption quantity measured by the current sensor 22, thereby extracting waveforms D2 and D3 corresponding to operation of the electric appliances 20. The waveform D2 represents an operation state of the specific appliance 20A that is specified in advance as being highly related to a presence-in-house possibility of the user among the electric devices set in the house 2. A waveform D3 represents an operation state of another appliance 20B other than the specific appliance 20A. When not distinguished from each other, the specific appliance 20A and another appliance 20B are referred to as the electric appliances 20.

The waveform analysis unit 190 may be provided in the presence-in-house determination system 1, or may be configured as a system different from the presence-in-house determination system 1. That is, the presence-in-house determination system 1 can acquire an analysis result of a waveform from a waveform analysis service provider that analyzes the change over time in the electric power consumption quantity of the house 2.

The presence-in-house determination unit 112A for the specific appliance determines that the user is present in the house or absent based on the waveform D2 indicating the operation state of the specific appliance 20A. The presence-in-house determination unit 112B for another appliance determines that the user is present in the house or absent based on the waveform D3 indicating the operation state of another appliance 20B. The presence-in-house determination unit 112A for the specific appliance and the presence-in-house determination unit 112B for another appliance correspond to a "second presence-in-house determination unit".

The presence-in-house determination unit 113 for the environment sensor determines that the user is present in the house or absent based on a detection signal of the environment sensor 23 set in the house 2 of the user. The environment sensor 23 measures and outputs information on a house environment of the house 2 of the user. The house environment includes, for example, a temperature, humidity, illuminance, sound, carbon dioxide concentration (concentration of $CO_2$), infrared rays, and atmospheric pressure. Specifically, for example, at least one of a room temperature, an outside air temperature, humidity inside and outside the house 2, illuminance inside and outside the house 2, concentration of $CO_2$ inside the house 2, intensity of infrared rays emitted from a heat source such as the user in the house 2, atmospheric pressure inside the house 2, and the like is detected by the environment sensor 23.

The environment sensor 23 is not necessarily set in the house 2 to be determined. The presence-in-house determination unit 113 for the environment sensor can also determine that the target house 2 is in the presence-in-house or absence situation by using an environment sensor set at a place different from the target house 2. For example, information such as a temperature (outside air temperature), humidity, and illuminance outside the target house 2 can be estimated by using information from another sensor set in the vicinity of the house 2. The presence-in-house determination unit 113 for the environment sensor can acquire weather of the target house 2 or the like from a server that distributes weather data without depending on the environment sensor 23 of the target house 2.

A plurality of parameters for the determination to be used in the presence-in-house determination units 111, 112A, 112B, and 113 can be prepared in advance, respectively. A parameter management unit 120 selects a parameter set 121 prepared in advance for each presence-in-house determination unit according to predetermined information. The selected parameter set 121 is sent to a corresponding presence-in-house determination unit.

The predetermined information for switching the parameter set 121 includes, for example, time information such as a year, a month, a day, and a day of a week, life environment information such as a family structure and a life pattern of the user, and residential environment information such as a temperature, humidity, and atmospheric pressure.

The parameter management unit 120 can acquire the time information such as a year, a month, a day, a day of a week, holiday information, and a time point from a calendar 160. The parameter management unit 120 can acquire weather information such as weather and disaster, a change in the number of passengers at a nearest station, and the like from an information distribution server 4 located outside the presence-in-house determination system 1.

Here, when a season is different, a pattern of the change over time in the electric power consumption quantity also changes. When weather is different, the pattern of the change over time in the electric power consumption quantity also changes. The pattern of the change over time in the electric power consumption quantity also changes in accordance with a life environment such as a family structure and whether the family structure is so-called diurnal or nocturnal, and a weekday work or a holiday work and whether the weekday work or the holiday work is diurnal or nocturnal. Similarly, an operation pattern of the electric appliances 20 also changes in accordance with the time information, the life environment information, and the residential environment information such as a season, weather, a day of a week, a time, a family structure, and a life pattern.

Customer information 151A is an example of data included in a first database 151 to be described below with reference to FIG. 2 and manages the family structure or the like of the user who serves as a customer.

Determination history 152A is an example of data included in a second database 152 to be described below with reference to FIG. 2 and manages history of determination results of the comprehensive determination unit 114.

The parameter management unit 120 of the present embodiment holds a plurality of parameter sets 121 in advance so as to deal with various cases. As described above, the parameter management unit 120 selects the parameter set 121 in accordance with the time information, the life environment information, and the residential environment information, and sets the selected parameter set 121 to the presence-in-house determination unit. The parameter management unit 120 can also select the parameter set 121 in consideration of the determination history 152A.

Selecting a parameter set is not limited to the case of selecting a parameter set from the plurality of parameter sets prepared in advance, but also includes a case where a parameter set prepared in advance is modified and used, or a case where a parameter is generated based on a predetermined equation.

A visualization unit 170 visualizes a determination result of the comprehensive determination unit 114 and outputs the visualized determination result to outside. The visualization unit 170 can also be referred to as a "determination result output unit" or a "determination result providing unit". The visualization unit 170 can output a screen by, for example, ranking presence-in-house possibilities of the user or expressing the presence-in-house possibilities of the user with numeric values.

A service implementation unit 180 provides a predetermined service by using a determination result of the presence-in-house possibility of the user received from the visualization unit 170. The predetermined service includes, for example, a presence-in-house possibility prediction service that provides a presence-in-house possibility for each individual or each region. A delivery provider, a visiting provider, an investigation company, and the like can improve efficiency of delivery or visiting by using the presence-in-house possibility prediction service.

According to the present embodiment configured as described above, the presence-in-house possibilities of the user can be determined by the plurality of presence-in-house determination units 111, 112A, 112B, and 113, and the comprehensive determination unit 114 can determine whether the user is present in the house 2 based on the determination results. As a result, determination accuracy can be improved as compared with a case where a presence-in-house situation of the user is determined based only on an electric power consumption quantity.

First Embodiment

The first embodiment will be described with reference to FIGS. 2 to 13. FIG. 2 is a functional block diagram of the presence-in-house determination system 1.

The presence-in-house determination system 1 is connected to the house 2 of each user and the information distribution server 4 via a communication network CN1. The presence-in-house determination system 1 can also be separately connected to a plurality of different information distribution servers 4. The information distribution server 4 includes, for example, a server that distributes weather information and a server that distributes news.

The presence-in-house determination system 1 is also connected to the computer system 3 operated by the service contract company via another communication network CN2. Hereinafter, the computer system 3 of the service contract company may be referred to as a service contract company 3. The communication networks CN1 and CN2 are shown as separate communication networks in the drawing, however, the communication networks CN1 and CN2 can also be configured as a common network.

The house 2 will be described. As described later, the house 2 includes, for example, the electric appliances 20A and 20B, the breaker 21, the current sensor 22, and the environment sensor 23.

The house 2 is provided with, for example, the electric appliances 20 such as an air conditioner, a washing machine, a microwave oven, a refrigerator, a rice cooker, a television, a cleaner, an IH cooking heater, an electric pot, an electric stove, and lighting. Weighting parameters used to determine the presence-in-house possibility of the user are set in advance for the electric appliances 20.

The electric appliances 20 can be roughly classified into two types. One type is the specific appliance 20A estimated to be highly related to a possibility (presence-in-house possibility) that the user is present in the house 2. The other type is another appliance (other appliances) 20B other than the specific appliance 20A.

In the present embodiment, an electric cleaner (to be manually operated by the user) will be described as an example of the specific appliance 20A. This is because the manually operated electric cleaner is operated by the user. Therefore, the presence-in-house possibility of the user is high when it is detected that the electric cleaner is operating. In addition to the manually operated electric cleaner, for example, an electric appliance that is highly possible to be manually operated by the user, such as an iron or a microwave oven, can also be set as the specific appliance 20A. Another appliance 20B is estimated to be less related to the presence-in-house possibility of the user and includes, for example, an electric appliance that always operates, an electric appliance that can be remotely operated by an outdoor user, and an electric appliance that can operate at a time set in a timer.

The house 2 is provided with the breaker 21 for distributing electric power received from an electric power system (not shown) to the electric appliances 20 in the house 2 or shutting off an electric power supply when an overcurrent flows to a load side (a side of the electric appliances 20). The current sensor 22 for monitoring a waveform of a source current distributed via the breaker 21 into the house 2 is provided in the breaker 21. The current waveform measured by the current sensor 22 is periodically transmitted to the presence-in-house determination system 1 via the communication network CN1. A voltage of the electric power supplied from the power system to the breaker 21 of the house 2 is constant based on a contract, and therefore the change over time in the electric power consumption quantity can be acquired from the current waveform.

The environment sensor 23 measures information on an environment in the house 2 (residential environment information) and transmits the measured information to the presence-in-house determination system 1 via the communication network CN1. The information measured by the environment sensor 23 and the data measured by the current sensor 22 may be transmitted to the presence-in-house determination system 1 at different timings, or may be transmitted at the same time.

The environment sensor 23 is, for example, a thermometer that measures a room temperature, a thermometer that measures an outside air temperature, a hygrometer that measures indoor humidity, a sensor that measures indoor carbon dioxide ($CO_2$) concentration, an infrared sensor that determines existence of a human, a sound pressure sensor (vibration sensor) that detects a sound, an atmospheric pressure sensor, an illuminance sensor that detects indoor brightness, an illuminance sensor that detects outdoor brightness, and the like. Not all sensors listed as examples need to be included in the house 2. Instead of an outdoor air thermometer or an outdoor illuminance meter, an outdoor air thermometer or an illuminance meter of another house 2 may be used, or information may be estimated from weather information.

The presence-in-house determination system 1 will be described. The presence-in-house determination system 1 is configured as a computer system including, for example, a central processing unit (CPU) 100, a memory 101, and a communication unit 102. The CPU 100 implements functions 110 to 180 to be described below by reading and executing a predetermined computer program stored in the memory 101.

The communication unit 102 communicates with each house (current sensor 22, environment sensor 23) and the information distribution server 4 via the communication network CN1. The communication unit 102 communicates with the computer system 3 of the service contract company via the communication network CN2.

The presence-in-house determination system 1 has functions of the presence-in-house or absence determination unit 110, the parameter management unit 120, a customer management unit 130, an API 140, the first database 151, the second database 152, the calendar 160, the visualization unit 170, and the service implementation unit 180.

The presence-in-house or absence determination unit 110 determines the presence-in-house possibility of the user based on, for example, the change over time in the electric power consumption quantity, operation states of the electric appliances 20, the time information acquired from the calendar 160, the residential environment information acquired from the environment sensor 23, and the life environment information acquired from the customer management unit 130.

The parameter management unit 120 manages parameters (weighting parameters) used in the presence-in-house or absence determination unit 110.

The customer management unit 130 manages the life environment information of each user stored in the first database 151. The life environment information includes, for example, a structure, ages, and a life pattern of the user and a family living together with the user. The life environment information may be registered in the first database 151 of the presence-in-house determination system 1 by the user by using a personal computer, a mobile phone (including a so-called smartphone), or the like. Alternatively, contractor data acquired from a server of an electric power company may be registered in the first database 151, or user data acquired from an electronic commerce system may be registered in the first database 151. The first database 151 may be referred to as a first storage unit.

The API (application programming interface) 140 has a function of receiving data (data of the current sensor 22, data of the environment sensor 23) received from each house 2. Each data received via the API 140 is stored in the second database 152. The presence-in-house or absence determination unit 110 determines the presence-in-house possibility of the user based on the data stored in the second database 152. A determination result (the presence-in-house possibility of the user) acquired by the presence-in-house or absence determination unit 110 is stored in the second database 152. The second database 152 may be referred to as a second storage unit.

The data (life environment information) stored in the first database 151 is used for selecting a parameter set for the determination of the presence-in-house possibility. Alternatively, the presence-in-house or absence determination unit 110 may determine the presence-in-house possibility of the user by using both the data stored in the first database 151 and the data stored in the second database 152.

The calendar 160 manages a time such as a year, a month, a day, a time point, a day of a week, and holidays. The calendar 160 can be provided inside the presence-in-house determination system 1, or can be provided outside the presence-in-house determination system 1 as one of the information distribution servers 4.

The visualization unit 170 visualizes and outputs a determination result of the presence-in-house or absence determination unit 110 so that the service implementation unit 180 easily uses the output determination result. For example, the visualization unit 170 outputs a presence-in-house state of each house 2 by expressing the presence-in-house state with a numerical value, a graph, or the like.

The service implementation unit 180 implements a service that provides an added value based on a result visualized by the visualization unit 170. For example, when an address, a user name, a postal code, a telephone number, a delivery slip number, an identification number of an investigation slip, and the like are input, the service implementation unit 180 provides a service such as outputting the presence-in-house possibility of the user in the corresponding house 2.

Alternatively, as described below, the service implementation unit 180 provides a service such as ranking the presence-in-house possibilities of the users in a certain region and outputting a change over time in the ranking.

An example of the presence-in-house determination based on the electric power consumption quantity will be described with reference to FIGS. 3 and 4. FIG. 3 shows a relationship between time-series data of the electric power consumption quantity and a threshold for determining the presence-in-house or absence situation when the presence-in-house or absence situation is determined based on the electric power consumption quantity.

In FIG. 3, a vertical axis indicates an electric power consumption quantity W of the house 2 and a horizontal axis indicates a time. “max” indicates a maximum value of the electric power consumption quantity W in a certain period (for example, one day). “min” indicates a minimum value of the electric power consumption quantity in the same period. “ave” indicates an average value of the electric power consumption quantity W in a certain period. A threshold ThU indicates an electric power consumption quantity which can be used to determine that the presence-in-house possibility of the user is high. A threshold ThL indicates an electric power consumption quantity which can be used to determine that a not-presence-in-house possibility of the user is high.

FIG. 4 shows a determination table T1 indicating a relationship between the thresholds ThU and ThL and the presence-in-house or absence determination result. The determination table T1 manages a number column C11, a condition column C12, and a determination result column C13 in association with each other.

The number column C11 manages a number set for each determination condition. The condition column C12 defines a condition for determining the presence-in-house possibility based on a magnitude relationship between the electric power consumption quantity of the house 2 and the threshold. The determination result column C13 stores a determination result.

In the present embodiment, when the electric power consumption quantity W of the house 2 is larger than the threshold ThU for the presence-in-house determination ($W>ThU$), it is determined that the presence-in-house possibility of the user is high (a circle mark in the drawing). On the other hand, when the electric power consumption quantity W is smaller than the threshold ThL for the absent determination ($W<ThL$), it is determined that the absent possibility of the user is high (an X mark in the drawing). Here, the user indicates a family that lives in the house 2 instead of each individual that constitutes the family. When any individual of the family exists in the house 2, the presence-in-house or absence determination unit 110 determines that there is the presence-in-house situation. When no individual of the family is in the house 2, the presence-in-house or absence determination unit 110 determines that there is the absent situation.

When the electric power consumption quantity W is equal to or larger than the threshold ThL for the absent determination and is equal to or less than the threshold ThU for the presence-in-house determination ($ThL \leq W \leq ThU$), it is determined that it is unclear whether the user is present in the house (a triangle mark in the drawing). In this case, there is a possibility that the user is present in the house, but the presence-in-house possibility is not as high as that of the evaluation of the circle mark.

The threshold ThU for the presence-in-house determination and the threshold ThL for the absent determination may be determined by statistical processing, or may be determined from data accumulated in the past, separately. The thresholds ThU and ThL may be determined by collating a life pattern (life rhythm) derived from a family structure, a family age structure, and the like with a transition pattern of the electric power consumption quantity. In the drawing, the presence-in-house possibility of the user is expressed by a symbol such as the circle mark, the X mark, and the A mark, but can be represented by a numerical value such as a probability or a rank instead of the symbol.

FIGS. 5 and 6 are explanatory diagrams showing a state where the presence-in-house possibility of the user is determined based on the operation states of the electric appliances 20.

FIG. 5 shows a change over time in presence-in-house coefficients set for the electric appliances 20. In the present embodiment, the presence-in-house coefficient that is an example of a “weighting parameter” is set for each electric appliance. In the present embodiment, the presence-in-house possibility of the user is calculated based on the presence-in-house coefficient of each electric appliance 20.

As described above, in the present embodiment, attention is paid to a fact that electric appliances (household electric products) used in a household include the specific appliance 20A that is closely related to the presence-in-house situation of the user and another appliance 20B that is less related to the presence-in-house situation of the user.

For example, a manually operated electric cleaner is an electric appliance to be manually operated by the user. Therefore, when operation of the electric cleaner is detected, the presence-in-house possibility of the user is high. On the other hand, a refrigerator normally operates constantly. An air conditioner may be operated all day for a pet or the like. A television, lighting, and the like may be operated or stopped by the user outside by remote operation. Therefore, it is considered that the appliance 20B other than the specific appliance 20A such as the air conditioner, the television, and the lighting is less related to the presence-in-house situation of the user.

Reference is made to FIG. 5. An operation state, that is, operation or stop of each electric appliance 20 placed in the house 2 can be estimated by analyzing the electric power consumption quantity detected by the current sensor 22 provided in the breaker 21 of the house 2.

An upper side of FIG. 5 shows characteristics L1 and L2 of the two types of electric appliances 20. The characteristic L1 is, for example, the characteristic of a manually operated electric cleaner. The characteristic L2 is, for example, the characteristic of an air conditioner. Since the manually operated electric cleaner cannot be used unless manually operated by the user, a presence-in-house coefficient Ch1 of the manually operated electric cleaner is set to be high. On the other hand, since a possibility that the air conditioner operates even when the user is absent is high, a presence-in-house coefficient Ch2 of the air conditioner is set to be low.

The manually operated electric cleaner is activated at a time point t1 and operated only for a time period Ton until a time point t2. The presence-in-house coefficient is the value Ch1 at the activated time point t1. The value Ch1 of the presence-in-house coefficient continues until the stop time point t2.

Here, after the manually operated electric cleaner is stopped at the stop time point t2, the presence-in-house coefficient Ch1 does not immediately become 0, but gradually decreases at a predetermined inclination θ and becomes 0 at a time point t4. This is because the presence-in-house possibility of the user is high at least during a predetermined time period Tc even after cleaning is performed using the manually operated electric cleaner. After the operation of the manually operated electric cleaner is stopped, it is considered that the presence-in-house possibility of the user gradually decreases.

Therefore, in the present embodiment, the presence-in-house coefficient of the electric appliance can be set to zero after the predetermined time period Tc has elapsed since the operation of the electric appliance is stopped. The predetermined time period Tc is referred to as a transition time Tc in the present embodiment. The transition time Tc can be set in advance in accordance with a type of the electric appliance or the like.

The characteristic L2 indicates that the air conditioner is activated at a time point t3 and stopped at a time point t5. The presence-in-house coefficient is the value Ch2 (<Ch 1) at the activated time point t3 and becomes 0 at the stop time point t5. For the characteristic L2, the transition time is set to be short, and therefore, a value of the presence-in-house coefficient rapidly becomes 0 after the operation of the electric appliance is stopped. The transition time Tc can be set to a value of 0 or more.

A lower side of FIG. 5 shows a characteristic L3 acquired by synthesizing the characteristics L1 and L2. In the present embodiment, the presence-in-house possibility of the user is determined by comprehensively determining the presence-in-house coefficient of each electric appliance 20 in the house 2.

The manually operated electric cleaner has been mainly described in the example of FIG. 5, but the invention is not limited thereto. For example, in a case of a rice cooker, the presence-in-house possibility of the user is high for a while after rice cooking operation is OFF. This is because normally there is a high possibility of eating a meal. In a case of a washing machine, after washing operation is OFF, there is a high possibility that the user dries laundry or puts the laundry in a dryer. Therefore, it can be predicted that the presence-in-house possibility is high for about 30 minutes. On the other hand, in the case of the air conditioner, it can be predicted that there is a high possibility that the user goes out in a relatively short time after operation thereof is stopped. As described above, in the present embodiment, the presence-in-house coefficient (weighting parameter 1) and the transition time (weighting parameter 2) that indicate a relationship with the presence-in-house possibility of the user are set in accordance with how the electric appliance is used. In the present embodiment, a relationship with the presence-in-house possibility of the user is expressed for each electric appliance by adjusting setting of the presence-in-house coefficient and the transition time.

FIG. 6 shows a determination table T2 of determining the presence-in-house or absence situation based on the presence-in-house coefficient. The determination table T2 manages, for example, a number column C21, a condition column C22, and a determination result column C23 in association with each other.

The number column C21 manages a number set for each determination condition. The condition column C22 defines a condition for determining the presence-in-house possibility of the user based on a magnitude relationship between a presence-in-house coefficient of the electric appliance 20 and a threshold. The determination result column C33 stores a determination result.

In the present embodiment, when the presence-in-house coefficient Ch1 of the specific appliance 20A is larger than a threshold ThC1 (Ch1>ThC1), it is determined that a presence-in-house possibility of the house 2 is high (circle mark). When all the presence-in-house coefficients of the electric appliances 20 are equal to or less than a threshold ThC2 (including 0), it is determined that a presence-in-house possibility of a house 3 is low. When a total value ΣCh2 of the presence-in-house coefficients Ch2 of another appliances 20B other than the specific appliances 20A is larger than the threshold ThC2 (ΣCh2>ThC2), it is determined that a presence-in-house possibility of a house of another appliances 20B is unclear (triangle mark). As described above, the term unclear refers to a state where there is the presence-in-house possibility, but the possibility is not as high as that of the case of the circle mark evaluation. The determination result may be expressed by a numerical value such as a probability or a rank instead of a symbol such as the circle mark, the triangle mark, and the X mark.

FIG. 7 is an example of a table T3 of managing operation times of the electric appliances 20. The table T3 manages the assumed operation time during the operation of each electric appliance. Once activated, the electric appliances 20 often continue to operate until activation purpose of the electric appliances 20 is achieved. An extent to which the electric appliances 20 continue to operate after being activated depends on a purpose of usage or properties of the electric appliances, a personality of the user, a lifestyle, and the like. However, an approximate value can be obtained by investigating the operation time of each electric appliance and performing statistical processing.

In the present embodiment, the operation states of the electric appliances 20 used in the house 2 are estimated by performing waveform analysis on the change over time in the electric power consumption quantity of the house 2. In the present embodiment, estimation accuracy of the operation states of the electric appliances 20 is improved by referring to the table T3 shown in FIG. 7.

In the present embodiment, when activation of an electric appliance is detected, it can be estimated that operation continues only for an estimated operation time specified in the table T3 even if a waveform analysis result is unstable during the analysis. For example, after start of operation (activation) of a washing machine is detected, even when a waveform of an electric power consumption quantity of the washing machine is lost for some reason, the washing machine is considered to continue to operate for about 30 minutes, and an operation state of the washing machine can be monitored. Accordingly, even when the detection of the waveform of the electric appliances 20 is intermittent, it is possible to stably determine the presence-in-house possibility of the user based on the presence-in-house coefficients of the electric appliances. The operation time can be estimated from other data instead of the management table T3 of the assumed operation time created from statistical data or the like, or together with the table T3. For example, in a case of a television, an operation time of the television can be estimated based on a family structure of the user and generational audience rating information.

FIG. 8 shows a parameter management table T4 showing an example of a presence-in-house coefficient and a transition time which are weighting parameters.

The parameter management table T4 manages, for example, an appliance type column C41, a parameter 1 column (presence-in-house coefficient column) C42, and a parameter 2 column (transition time column) C43 in association with each other.

In the appliance type column C41, a type of the electric appliance 20 is stored. In the parameter 1 column C42, a value of the presence-in-house coefficient described in FIG. 5 is set. In the parameter 2 column C43, the transition time until the presence-in-house coefficient decreases to 0 is set. It is assumed that the larger the value of the presence-in-house coefficient, the higher the presence-in-house possibility of the user, and the smaller the value of the presence-in-house coefficient, the lower the presence-in-house possibility of the user. The larger the value of the transition time, the higher the presence-in-house possibility of the user even after operation of an electric appliance having the transition time is stopped. When a value of the transition time is small, it is shown that the presence-in-house possibility of the user is low after operation of an electric appliance is stopped.

FIG. 9 shows another example of the parameter management table T4. The parameter management table T4 can be prepared, for example, in accordance with combinations of indexes such as a life pattern (life style), a season, and a family structure.

For example, in the parameter management table T4 (1), a value of a weighting parameter (presence-in-house coefficient, transition time) of the parameter management table 4 described in FIG. 8 is adjusted by a combination of the life pattern and the season. Similarly, for example, in the parameter management table T4 (2), a value of a weighting parameter is adjusted by a combination of the family structure and the life pattern of the user. Further, for example, in the parameter management table T4 (3), a value of a weighting parameter is adjusted by a combination of a weather condition and a season. In addition to the example shown in FIG. 9, a weighting parameter can be set from various viewpoints.

FIG. 10 is a flowchart showing overall processing of the presence-in-house or absence determination. The presence-in-house determination system 1 receives data at a predetermined cycle via the API 140 to determine whether there is update data (S10). The data to be received includes electric power consumption data indicating the change over time in the electric power consumption quantity of the house 2, electric appliance data (electric appliance operation state information) indicating the operation states of the electric appliances 20 extracted from the electric power consumption data, and environment data (environment information) acquired from the sensor 23 or the information distribution server 4.

When determining that there is update data (S10: YES), the presence-in-house determination system 1 acquires the update data from the API 140 (S11) and stores the acquired update data in the second database 152 (S12). The presence-in-house or absence determination unit 110 of the presence-in-house determination system 1 refers to each piece of the data (electric power consumption data, electric appliance operation state information, environment information) stored in the database 152 and the parameters (the presence-in-house coefficient and the transition time which are the weighting parameters) provided by the parameter management unit 120 (S13), and determines the presence-in-house possibility of the user (S14). Details of step S14 will be described below with reference to FIG. 11.

A determination result acquired by the presence-in-house or absence determination unit 110 is stored in the second database 152 (S15). A database for storing the determination result may be separately prepared. The visualization unit 170 acquires the determination result of the presence-in-house or absence determination unit 110 from the database 152 and visualizes the determination result in a form of a graph, a table, or the like (S16). As described below, the presence-in-house possibility of the user can be statistically processed and displayed in association with map information.

FIG. 11 is a flowchart showing an example of step S14 in FIG. 10. In the present embodiment, the presence-in-house possibility of the user is comprehensively determined by combining a plurality of pieces of different processing including determination processing S100 based on the change over time in the electric power consumption quantity and determination processing S200 based on the presence-in-house coefficients of the electric appliances 20.

Here, the processing S100 is performed by the presence-in-house determination unit 111 for the electric power consumption quantity shown in FIG. 1 in the presence-in-house or absence determination unit 110. The processing S200 is performed by the presence-in-house determination unit 112A for the specific appliance and the presence-in-house determination unit 112B for another appliance that are shown in FIG. 1 in the presence-in-house or absence determination unit 110. An example of operation of the presence-in-house determination unit 113 for the environment sensor will be described below with another embodiment.

First, the determination processing S100 based on the electric power consumption quantity will be described. The presence-in-house or absence determination unit 110 acquires the electric power consumption data and the threshold parameter (S101), and determines whether the electric power consumption quantity W is larger than the threshold ThU for the presence-in-house determination (S102). When the presence-in-house or absence determination unit 110 determines that the electric power consumption quantity W is larger than the threshold ThU for the presence-in-house determination (S102: YES), it is determined that the presence-in-house possibility of the user is high (S103).

When the presence-in-house or absence determination unit 110 determines that the electric power consumption quantity W is equal to or less than the threshold ThU for the presence-in-house determination (S102: NO), it is determined whether the electric power consumption quantity W is smaller than the threshold ThL for the absent determination (S104). When the presence-in-house or absence determination unit 110 determines that the electric power consumption quantity W is smaller than the threshold ThL for the absent determination (S104: YES), it is determined that the absent possibility of the user is high (S105).

When the presence-in-house or absence determination unit 110 determines that the electric power consumption quantity W is equal to or larger than the threshold ThL for the absent determination (S104: NO), it is determined that the presence-in-house possibility of the user is unclear (S106). The presence-in-house or absence determination unit 110 outputs a determination result based on the change over time in the electric power consumption quantity to step S300 of calculating a presence-in-house rank (S107). The presence-in-house rank is an example of a "predetermined index value indicating the presence-in-house possibility of the user". Step S300 is performed by the comprehensive determination unit 114 shown in FIG. 1 in the presence-in-house or absence determination unit 110.

Next, the determination processing S200 based on the presence-in-house coefficients of the electric appliances 20 will be described. The presence-in-house or absence determination unit 110 acquires information indicating the operation state of each electric appliance 20 in the house 2 and reference values of the presence-in-house coefficients and the transition times (S201).

The presence-in-house or absence determination unit 110 generates a presence-in-house coefficient based on a reference value of the presence-in-house coefficient in consideration of information such as a family structure, a season, a time zone, a room temperature, and weather (S202).

The presence-in-house or absence determination unit 110 determines whether a presence-in-house coefficient of a cleaner that is an example of the specific appliance 20A is larger than the threshold Thc1 (S203). When the presence-in-house or absence determination unit 110 determines that the presence-in-house coefficient Ch1 of the specific appliance 20A is larger than the threshold ThC1 (S203: YES), it is determined that the presence-in-house possibility of the user is high (S204).

When the presence-in-house or absence determination unit 110 determines that the presence-in-house coefficient of the specific appliance 20A is equal to or less than the threshold ThC1 (S203: NO), it is determined whether a total value ΣC2 of the presence-in-house coefficients Ch2 of another appliances 20B is larger than the threshold ThC2 (S205). When the presence-in-house or absence determination unit 110 determines that the total value ΣC2 of the presence-in-house coefficients of another appliances 20B is not larger than the threshold ThC2 (S205: NO), it is determined that the presence-in-house possibility is low (S207).

When the presence-in-house or absence determination unit 110 determines that the total value ΣC2 of the presence-in-house coefficients of another appliances 20B is larger than the threshold ThC2 (S205: YES), it is determined that there is a possibility that the user is present in the house, but the possibility is not as high as that of the evaluation in step S204 (S206). The presence-in-house or absence determination unit 110 outputs a determination result based on the presence-in-house coefficient to step S300 (S208).

The presence-in-house or absence determination unit 110 comprehensively evaluates the presence-in-house possibility of the user in accordance with the determination result (S107) based on the electric power consumption quantity and the determination result (S208) based on the presence-in-house coefficient, and outputs a result of the evaluation as the presence-in-house rank (S300).

FIG. 12 shows an example of a table T5 of determining the presence-in-house rank. The table T5 manages, for example, a number column C51, a determination result column C52 based on the electric power consumption quantity, a determination result column C53 based on the presence-in-house coefficient, and a presence-in-house rank column C54 in association with each other.

The electric power consumption quantity determination result column C52 shows a result of the presence-in-house possibility determined based on the electric power consumption quantity. The presence-in-house coefficient determination result column C53 shows a result of the presence-in-house possibility determined based on the presence-in-house coefficient. The presence-in-house rank column C54 indicates a rank value calculated from the determination result based on the electric power consumption quantity and the determination result based on the presence-in-house coefficient. The presence-in-house rank can also be referred to as comprehensive evaluation.

In the example of FIG. 12, as indicated by a number "1", a highest rank "5" is given to a case where the presence-in-house possibility based on the electric power consumption quantity is high (circle mark), and the presence-in-house possibility based on the presence-in-house coefficient is also high (circle mark). On the other hand, as indicated by a number "9", a lowest rank "0" is given to a case where the presence-in-house possibility based on the electric power consumption quantity is low (X mark), and the presence-in-house possibility based on the presence-in-house coefficient is also low (X mark).

As indicated by numbers "2" and "3", when the presence-in-house possibility based on the presence-in-house coefficient is not high (triangle mark, X mark), the presence-in-house rank value is lower than the highest rank "5" even when the presence-in-house possibility based on the electric power consumption quantity is high (circle mark). When the presence-in-house possibility based on the presence-in-house coefficient is low, the presence-in-house rank serving as the "comprehensive evaluation" is corrected to a low value even when the presence-in-house possibility based on the electric power consumption quantity is high.

As indicated by numbers "4" and "7", when the presence-in-house possibility based on the presence-in-house coefficient is high (circle mark), the presence-in-house rank is corrected to a high value even when the presence-in-house possibility based on the electric power consumption quantity is not high (triangle mark, X mark).

As described above, in the present embodiment, the presence-in-house possibility based on the electric power consumption quantity can be corrected by the presence-in-house possibility based on the presence-in-house coefficient, and comprehensive evaluation having high reliability can be calculated.

FIG. 13 shows a presence-in-house rank determination table T6 according to a modification. The table manages, for example, a number column C61, a determination result column C62 based on the electric power consumption quantity, a determination result column C63 based on the presence-in-house coefficient, a prediction column C64, and a presence-in-house rank column C65 in association with each other. Here, the columns C61, C62, C63, and C65 correspond to the columns C51, C52, C53, and C54 described in FIG. 12, and therefore a description thereof will be omitted.

The prediction column C64 indicates prediction of a presence-in-house possibility based on a past determination result. For example, determination accuracy of a current presence-in-house possibility can be improved by referring to a past determination result such as a determination result in the same time zone one week ago. In a case of a past determination result of about one week or one month ago, it is expected that there is not much change in a temperature and a life pattern caused by a season. Therefore, the past determination result can be referred to as a predicted value. A presence-in-house possibility on the same day of a week one year ago corresponding to today may be referred to as the predicted value. The predicted value may be a determination result (estimated value) of a presence-in-house possibility performed in the past, or may be an actual value confirmed later with other data such as a railway usage history.

In the prediction column C64 of FIG. 13, numbers "5" to "8", "10", and "11" are described with either a circle mark or an X mark, and other numbers are described with a hyphen. This means that the prediction column C64 is referred to only in a case where it is difficult to make determination only by a presence-in-house possibility based on an electric power consumption quantity and by a presence-in-house possibility based on a presence-in-house coefficient. The prediction column C64 is not referred to when the determination can be made only by the presence-in-house possibility based on the electric power consumption quantity and by the presence-in-house possibility based on the presence-in-house coefficient. In a case where the prediction column C64 is not referred to, a hyphen is described.

Whether to refer to a presence-in-house or absence predicted value is considered to depend on each house and depend on a service to which a presence-in-house or absence determination result is applied. Therefore, whether to refer to the presence-in-house or absence predicted value may be set depending on a condition, a state and the like.

According to the present embodiment configured as described above, it is possible to determine the presence-in-house possibility of the user with higher accuracy than that of the related art by making comprehensive determination in accordance with the presence-in-house possibility based on the electric power consumption quantity and the presence-in-house possibility based on the presence-in-house coefficient.

In the present embodiment, the electric appliances 20 provided in the house 2 of the user are classified into the specific appliance 20A specified in advance as being highly related to the presence-in-house possibility of the user and another appliance 20B, and the presence-in-house possibility of the user is determined from the presence-in-house coefficient indicating the operation state of the specific appliance 20A and the presence-in-house coefficient indicating the operation state of another appliance 20B. Therefore, for example, when operation of the specific appliance 20A such as a manually operated electric cleaner that is highly possible to be manually operated by the user is detected, the presence-in-house possibility can be determined with high accuracy. Even when the operation of the specific appliance 20A cannot be detected, the presence-in-house possibility can be determined with high accuracy by considering the operation state of another appliance 20B within a certain period of time after the operation of the specific appliance 20A is stopped.

In the present embodiment, the presence-in-house coefficient indicating the operation state of the electric appliance 20 is not immediately treated as 0 after the operation of the electric appliance is stopped, but is gradually decreased until the predetermined transition time elapses, and is used for determining the presence-in-house possibility. Therefore, the operation states of the electric appliances 20 can be interpreted in accordance with an actual life of the user, and the presence-in-house possibility can be determined more accurately than that of the related art.

In the present embodiment, as described with reference to FIG. 7, since the assumed operation time is set for each type of the electric appliance 20, it is possible to detect the operation state of the electric appliance based on the assumed operation time even when the waveform data indicating the change over time in the electric power consumption quantity cannot be completely analyzed.

Second Embodiment

The second embodiment will be described with reference to FIGS. 14 to 17. In the following embodiments including this embodiment, differences from the first embodiment will be mainly described. In the present embodiment, it is assumed that the determination algorithm described in the first embodiment is used, and determination accuracy of a presence-in-house or absence situation is improved by using environment data such as temperature and humidity.

FIG. 14 is an example of a table T7 that defines the environment data. The table T7 includes, for example, a number C71, an item column C72, and a content column C73. The item column C72 stores a type of the environment data, for example, a temperature (room temperature, outside air temperature), humidity, illuminance, a concentration of carbon dioxide (concentration of $CO_2$), sound, and human presence (presence or absence of infrared rays). The content column C73 describes contents of the environment data set in the item column C72.

When the house 2 is provided with a human sensor from the beginning and a detection signal of the human sensor can be used by the presence-in-house determination system 1, it is possible to determine whether the user is present in the house with a high probability. Assuming that no pet is kept, it can be determined that a presence-in-house possibility of the user is high when the concentration of carbon dioxide is high. When the user is present in the house, some life sound is generated, and therefore the presence-in-house possibility of the user can be determined from a detection signal of a sound sensor or a sound pressure sensor.

When the environment sensor 23 that measures the environment data in this manner is set in the house 2 and can be used by the presence-in-house determination system 1, the presence-in-house possibility of the user can be determined using the environment data. However, it is possible that the determination accuracy of the presence-in-house possibility cannot be increased by only using the environment data. Therefore, in the present embodiment, the determination accuracy is improved by combining the presence-in-house or absence determination algorithm of the first embodiment and the environment data.

It is not necessary to acquire all the environment data from the environment sensor 23 in the house 2, and the environment data may be acquired from the server 4 or the like and used.

FIG. 15 is a flowchart showing a first modification of a presence-in-house or absence determination processing according to the present embodiment. In the first modification, a third determination processing S400 (a determination processing 3 in the drawing) is executed in addition to the first determination processing S100 (the determination processing 1 in the drawing) that determines the presence-in-house or absence situation based on an electric power consumption quantity, and the second determination processing S200 (the determination processing 2 in the drawing) that determines the presence-in-house or absence situation based on a presence-in-house coefficient. In the third determination processing 400, as described below, the presence-in-house or absence situation is determined based on a relationship between an appliance such as a constantly operating refrigerator and a room temperature.

The third determination processing S400 focuses on a refrigerator that is constantly operating. Usually, the refrigerator intermittently controls a compressor used for cooling to maintain a temperature in the refrigerator. During intermittent operation, when the temperature in the refrigerator rises, a current value is increased, and when the temperature in the refrigerator reaches a set temperature or lower, the current value is decreased. It is considered that a cycle of the intermittent operation depends on a temperature change in the refrigerator caused by a room temperature or human opening and closing operation.

Therefore, in the present embodiment, the third determination processing S400 that focuses on a change in electric power of the refrigerator and on the room temperature is executed.

After acquiring data such as the electric power consumption quantity and a parameter such as a threshold (S401), the presence-in-house or absence determination unit 110 determines whether a change ΔW in the electric power consumption quantity per unit time of the constantly operating appliance to be determined is equal to or larger than a predetermined threshold ThΔW (S402).

When the change over time ΔW in the electric power consumption quantity of the constantly operating appliance is equal to or larger than the threshold ThΔW, the presence-in-house or absence determination unit 110 determines whether the room temperature is equal to or lower than a predetermined threshold ThTA (S403).

When the change over time ΔW in the electric power consumption quantity of the constantly operating appliance is less than the threshold ThΔW (S402: NO), the presence-in-house or absence determination unit 110 determines that the presence-in-house possibility is low (X mark) (S404). It is considered that the user uses the constantly operating appliance once in a while when present in the house. Further, it is considered that when the change over time ΔW in the electric power consumption quantity of the constantly operating appliance is small, the constantly operating appliance is not used by the user. Therefore, it can be determined that the presence-in-house possibility is low.

Even when the change over time ΔW in the electric power consumption quantity of the constantly operating appliance is equal to or larger than the threshold ThΔW (S402: YES), in a case where the room temperature is higher than the predetermined threshold ThTA (S403: NO), it is considered that the compressor is operated to deal with the high room temperature. Therefore, the presence-in-house or absence determination unit 110 determines that the presence-in-house possibility is low (S404).

On the other hand, when the change over time ΔW in the electric power consumption quantity of the constantly operating appliance is equal to or larger than the threshold ThΔW (S402: YES) and the room temperature is equal to or less than the predetermined threshold ThTA (S403: YES), the electric power consumption quantity increases and is larger than the threshold ThΔW even though the room temperature is not high. That is, it is considered that the electric power consumption quantity increases as a result of using the constantly operating appliance by the presence-in-house user, and therefore the presence-in-house or absence determination unit 110 determines that the presence-in-house possibility is high (circle mark) (S405).

A determination result of the third determination processing S400 is output to step S300 of calculating a presence-in-house rank (S406). The presence-in-house or absence determination unit 110 calculates the presence-in-house possibility of the user and ranks the possibilities on the basis of a determination result of the first determination processing S100 based on the electric power consumption quantity, a determination result of the second determination processing S200 based on the presence-in-house coefficient, and the determination result of the third determination processing S400 based on the relationship between the operation state of the constantly operating appliance and the room temperature (S300).

For example, when the presence-in-house possibility is unclear by only using the determination result of the first determination processing S100 and the determination result of the second determination processing S200, the presence-in-house or absence determination unit 110 can determine whether there is the presence-in-house possibility in consideration of the determination result of the third determination processing S400. Alternatively, the presence-in-house or absence determination unit 110 may quantify the determination results of the respective determination processing S100, S200, and S400 and rank the presence-in-house possibilities from a total value of weights.

The change over time in an electric power quantity serving as an analog value is used as the threshold ThΔW. Alternatively, reference is made to ON and OFF periods during the intermittent operation, and the operation state of the constantly operating appliance may be estimated from a length of the ON time, a frequency of an ON state within a predetermined period, and the like.

FIG. 16 is a flowchart showing a second modification of the presence-in-house or absence determination processing according to the present embodiment. In the second modification, a fourth determination processing S500 (determination processing 4 in the drawing) using a human sensor as an example of the environment sensor 23 is executed. The human sensor detects existence of a human by measuring, for example, an infrared ray generated by a body temperature of the human, and a sound produced by the human.

The presence-in-house or absence determination unit 110 acquires measurement data from the human sensor and a parameter such as a threshold (S501), and determines whether the human sensor has detected existence of a human (S502). For example, when an intensity of an infrared ray in a predetermined wavelength range is equal to or greater than a predetermined threshold or when a sound of a predetermined frequency continues for a predetermined period or longer, it can be estimated that a human exists.

When the human sensor detects the existence of the human (S502: YES), the presence-in-house or absence determination unit 110 determines that a presence-in-house possibility is high (circle mark) (S503). On the other hand, when the human sensor cannot detect the existence of the human (S502: No), the presence-in-house or absence determination unit 110 determines that the presence-in-house possibility is low (X mark) (S504). A determination result of the fourth determination processing S500 is output to step S300 of calculating a presence-in-house rank. In step S300, the presence-in-house possibilities of the user are calculated and output after being ranked on the basis of a determination result of the first determination processing S100 based on an electric power consumption quantity, a determination result of the second determination processing S200 based on a presence-in-house coefficient, and the determination result of the fourth determination processing S500.

FIG. 17 is a flowchart showing a third modification of the presence-in-house or absence determination processing. In the third modification, a carbon dioxide concentration sensor is used as the environment sensor, and a fifth determination processing (determination processing 5 in the drawing) of determining the presence-in-house possibility based on a concentration of carbon dioxide is executed.

The presence-in-house or absence determination unit 110 acquires measurement data of the carbon dioxide concentration sensor and a parameter such as a threshold (S601), and determines whether the concentration of carbon dioxide is equal to or higher than a predetermined threshold ThCO2 (S602).

When determining that the concentration of carbon dioxide is equal to or higher than the threshold ThCO2 (S602: YES), the presence-in-house or absence determination unit 110 determines that the presence-in-house possibility is high (circle mark) (S603). This is because when a human exists in the house 2, the concentration of carbon dioxide is high. On the other hand, when determining that the carbon dioxide concentration is less than the threshold ThCO2 (S602: NO), the presence-in-house or absence determination unit 110 determines that the presence-in-house possibility is low (X mark) (S604). A result of the fifth determination processing is output to step S300 of calculating a presence-in-house rank (S605).

The presence-in-house or absence determination unit 110 calculates the presence-in-house possibility of the user and ranks the possibilities on the basis of a determination result of the first determination processing S100 based on an electric power consumption quantity, a determination result of the second determination processing S200 based on a presence-in-house coefficient, and the determination result of the fifth determination processing S600 based on a measurement result of the carbon dioxide concentration sensor (S300).

The present embodiment configured as described above also has the same effects as those of the first embodiment. Further, in the present embodiment, since the operation state of the constantly operating appliance and the measurement data (room temperature, human feeling, and carbon dioxide concentration) of the environment sensor 23 are also taken into consideration, the presence-in-house possibility can be determined with higher accuracy than that of the case of the first embodiment.

In the present embodiment, the presence-in-house possibility is determined by extracting the operation state of the constantly operating appliance such as a refrigerator considered to be less related to the presence-in-house possibility of the user from waveform data of the electric power consumption quantity, and comparing the operation state with the room temperature. In the present embodiment, by combining with the room temperature that is the environment data, the operation state of the constantly operating appliance can be related to the presence-in-house possibility of the user, and the presence-in-house possibility can be determined based on the operation state of the constantly operating appliance.

It should be noted that the presence-in-house or absence determination processing shown in FIGS. 15 to 17 may be combined as appropriate. For example, the first determination processing S100 based on the electric power consumption quantity, the second determination processing S200 based on the presence-in-house coefficient, the third determination processing S400 based on operation state of the constantly operating appliance, the fourth determination processing S500 based on the measurement data of the human sensor, and the fifth determination processing S600 based on the measurement data of the carbon dioxide concentration sensor are separately executed, and the presence-in-house possibilities may be comprehensively determined and ranked in step S300.

Third Embodiment

The third embodiment will be described with reference to FIG. 18. In the present embodiment, a function of presence-in-house or absence determination and a function of providing a service by using a determination result are implemented on a separate computer system.

FIG. 18 shows an overall outline of an information processing system including a presence-in-house determination system 1A. In the present embodiment, the service implementation unit 180, the customer management unit 130, and the first database 151 in the presence-in-house determination system 1 described in FIG. 1 are implemented on the computer system 5 managed by a service provider. Only one computer system managed by the service provider is shown in the drawing, but the presence-in-house determination system 1A can supply a determination result of a presence-in-house possibility to a plurality of computer systems. Similarly, the computer system 5 of the service provider can separately provide a service to different service contract companies.

The presence-in-house determination system 1A according to the present embodiment includes the presence-in-house or absence determination unit 110, the parameter management unit 120, the API 140, the second database 152, the calendar 160, and the visualization unit 170. The configuration of the house 2 is the same as that of the first embodiment, and a description thereof will be omitted.

For example, the computer system 5 (service providing system 5) managed by a service provider such as an electric power company is linked to the presence-in-house determination system 1A to provide the presence-in-house possibility of each house 2 to a service contract company 1 such as a delivery provider.

The present embodiment configured as described above also has the same effects as those of the first embodiment. In the present embodiment, the function of the presence-in-house or absence determination and the function of providing the service by using the presence-in-house or absence determination result (presence-in-house possibility) are distributed and linked to computer systems managed by different providers. Therefore, a determination result of the presence-in-house determination system 1A can be applied to various services, and usability is improved.

Fourth Embodiment

The fourth embodiment will be described with reference to FIGS. 19 to 21. In the present embodiment, a presencein-house or absence determination result is provided after statistical processing for each region.

FIG. 19 is a functional configuration diagram of a presence-in-house determination system 1B according to the present embodiment. The presence-in-house determination system 1B is different from the presence-in-house determination system 1 described in the first embodiment in that a map management unit 1000 is included therein.

The map management unit 1000 supplies map data in a predetermined range to the presence-in-house or absence determination unit 100, the customer management unit 130, and the visualization unit 170. The customer management unit 130 manages an address of the house 2 which is a target of the presence-in-house determination system 1. Therefore, the visualization unit 170 can display and output a presence-in-house possibility for each time zone of each region by aggregating determination results of the presence-in-house or absence determination unit 110 for each region. A flow of people can be visualized by comparing changes over time in the presence-in-house possibilities between adjacent regions.

FIG. 20 shows an example of a screen G1 that aggregates and displays the presence-in-house possibilities by regions and time zones. For example, the example is described assuming that there are a district A, a district B, a district C, and a district D.

The presence-in-house determination system 1B according to the present embodiment totals up time-series data of determination results of presence-in-house possibilities of houses in each district, and divides the total number by a total number of data collection households in the district. Accordingly, the presence-in-house determination system 1B can calculate an average value of presence-in-house ranks for each district and provide the average value in a graph. In the graph in FIG. 20, a vertical axis indicates a presence-in-house rank and a horizontal axis indicates a time.

FIG. 21 shows an example of a method for presenting a presence-in-house rank. The example of FIG. 21 has a seven-stage configuration, in order from a top side, including a total electric power consumption quantity, an operation state of an air conditioner, an operation state of a washing machine, an operation state of a rice cooker, an operation state of a television, an operation state of a cleaner, and a presence-in-house rank indicating a result of presence-in-house or absence determination. These seven types of data are respectively time-series data for one day. The operation states (appliance separation data) of the electric appliances 20 such as the air conditioner, the rice cooker or the like can be extracted by analyzing waveform data of an electric power consumption quantity shown in an uppermost part.

The total electric power consumption quantity is slightly increased around 11:00, but it cannot be determined that there is a presence-in-house situation only by the increase. However, the operation state of the rice cooker is in an ON state, and therefore it is determined that there is the presence-in-house possibility (presence-in-house rank=2). It should be noted that a correlation between the rice cooker and the presence-in-house situation differs depending on each house, and it goes without saying that FIG. 21 is an example.

In the example of FIG. 21, the presence-in-house rank has six levels of 0 to 5, and corresponds to a presence-in-house possibility (presence-in-house ratio) of 20% per stage. Therefore, a presence-in-house rank 0 represents a presence-in-house possibility of 0%, a presence-in-house rank represents a presence-in-house possibility of 20%, a presence-in-house rank 2 represents a presence-in-house possibility of 40%, a presence-in-house rank 3 represents a presence-in-house possibility of 60%, a presence-in-house rank 4 represents a presence-in-house possibility of 80%, and a presence-in-house rank 5 represents a presence-in-house possibility of 100%.

However, the correspondence between the presence-in-house possibility and the rank is not limited to the above example. A rank definition or a rank threshold can be set according to a type of a service using the presence-in-house possibility. For example, when a delivery provider determines a delivery possibility, the presence-in-house rank may be divided into three stages. A presence-in-house rank 0 may be defined that delivery should not be performed, a presence-in-house rank 1 may be defined that there is a risk of an absence situation but the delivery may be performed, and a presence-in-house rank 2 may be defined that there is almost a presence-in-house situation and the delivery should be performed. In any case, the visualization unit 170 provides the visualization screen of the time-series data as shown in FIG. 21 to a service provider.

The present embodiment configured as described above also has the same effects as those of the first embodiment. In the present embodiment, the presence-in-house possibility can be output after being statistically processed and visualized for each region or time zone, which improves usability for the service provider. The service provider can use the presence-in-house possibility for each time zone of each region as a determination reference for applying various services such as route selection during a delivery.

In the present embodiment, the electric power consumption quantity, the operation states of the electric appliances, and the time-series data of presence-in-house ranks can be displayed in a graph so as to be listed. Therefore, for an administrator or the service provider of the presence-in-house determination system 1, not only a change over time in the presence-in-house rank can be easily known, but also a calculation basis of the presence-in-house rank can be read from the graph relatively easily, and the usability is high.

Fifth Embodiment

The fifth embodiment will be described with reference to FIG. 22. In the present embodiment, when a presence-in-house possibility cannot be determined by the first determination processing based on an electric power consumption quantity, a result of the second determination processing based on a presence-in-house coefficient is referred to.

FIG. 22 is a flowchart of step S300A of calculating a presence-in-house rank. The presence-in-house or absence determination unit 110 determines whether a result of the first determination processing S100 based on the electric power consumption quantity is unclear (triangular mark) (S301).

When the result of the first determination processing based on the electric power consumption quantity is "unclear" (S301: YES), the presence-in-house or absence determination unit 110 refers to the determination result of the second determination processing S200 based on the presence-in-house coefficient (S302).

The presence-in-house or absence determination unit 110 determines whether the second determination processing determines that the presence-in-house possibility is high (circle mark) (S303). When the second determination processing determines that the presence-in-house possibility is high (S303: Yes), the presence-in-house or absence determination unit 110 determines that the presence-in-house possibility is high (circle mark) as a comprehensive determination result (S304).

When the second determination processing determines that the presence-in-house possibility is not high (S303: NO), the presence-in-house or absence determination unit 110 determines whether the determination result of the second determination processing is "unclear" (S305). When the determination result of the second determination processing is "unclear" (S305: YES), the presence-in-house or absence determination unit 110 determines that the presence-in-house possibility is unclear (triangle mark) as a comprehensive determination result (S306). On the contrary, when the second determination processing determines that the presence-in-house possibility is not "unclear", that is, the presence-in-house possibility is low (X mark) (S305: NO), the presence-in-house or absence determination unit 110 determines that the presence-in-house possibility is low (X mark) as a comprehensive determination result (S307).

The present embodiment configured as described above also has the same effects as those of the first embodiment. In the present embodiment, when the presence-in-house possibility cannot be clearly determined only by the determination processing based on the electric power consumption quantity, the result of the determination processing based on the presence-in-house possibility is referred to. That is, when the determination cannot be made only by the first determination processing, the second determination processing complements the first determination processing.

The present invention is not limited to the above embodiments, and includes various modifications. For example, the embodiments described above have been described in detail for easy understanding of the invention, and the invention is not necessarily limited to those including all the configurations described above.

Some or all of the above-described configurations, functions, processing units, processing methods, and the like may be implemented by hardware, for example, by designing with an integrated circuit. Some or all of the above-described configurations, functions, processing units, processing methods, and the like may be implemented by a cloud system by designing, for example, a virtual machine.

The above-described configurations, functions, and the like may be implemented by software by interpreting and executing programs that implement the respective functions by a processor. Information such as a program, a table, and a file that implements each function can be stored in a recording device such as a memory, a hard disk, a Solid State Drive (SSD), or in a recording medium such as an IC card, an SD card, or a DVD.

Control lines and information lines indicate what is considered necessary for explanation, and not all control lines and information lines in the products are shown. It may be considered that almost all the configurations are actually connected to each other.

Any selection can be optionally made from each component of the invention, and an invention which includes the selected configuration is also included in the invention. The configurations described in the claims can be combined in a manner that is not clearly described in the claims.

REFERENCE SIGN LIST

1, 1A, 1B presence-in-house determination system
2 house
3 service contract company
4 information distribution server
20A specific appliance
20B another appliance
21 breaker
22 current sensor
23 environment sensor
110 presence-in-house or absence determination unit
120 parameter management unit
130 customer management unit
170 visualization unit
180 service implementation unit

The invention claimed is:

1. A presence-in-house determination system that determines whether a user is present in a house, the presence-in-house determination system comprising:
- a memory storing at least one program;
- a processor, which when executing the at least one program, configures the processor to:
- determine whether the user is present in the house based on a change over time in electric power consumption of the house of the user as a first determination result;
- determine whether the user is present in the house based on an operation state of at least one electric appliance provided in the house as a second determination result;
- determine whether the user is present in the house based on the first determination result and the second determination result as a third determination result; and
- output the third determination result for each region set on a map by statistically processing a change over time in a presence-in-house possibility of each user that exists in the region.

2. The presence-in-house determination system according to claim 1, wherein
- a weighting parameter is set for the electric appliance in advance in association with the operation state of the electric appliance, the weighting parameter being set larger as a relationship with a presence-in-house possibility of the user is higher, and
- the processor is further configured to determine whether the user is present in the house based on the weighting parameter as the second determination result.

3. The presence-in-house determination system according to claim 2, wherein
- the at least one electric appliance is classified in advance into a specific appliance that is highly related to the presence-in-house possibility of the user, and another appliance, and
- the processor is further configured to determine whether the user is present in the house based on a weighting parameter set for the specific appliance, and determine whether the user is present in the house based on a weighting parameter set for another appliance as the second determination result.

4. The presence-in-house determination system according to claim 2, wherein
- the weighting parameter is set to decrease over time.

5. The presence-in-house determination system according to claim 4, wherein
- the weighting parameter is set such that a value of the weighting parameter decreases with a predetermined inclination after operation of the corresponding electric appliance is stopped.

6. The presence-in-house determination system according to claim 5, wherein
- a plurality of weighting parameters are prepared for the electric appliances, and
- the processor is further configured to determine whether the user is present in the house by selecting at least one weighting parameter from the plurality of weighting parameters in accordance with predetermined information as the second determination result.

7. The presence-in-house determination system according to claim 6, wherein the predetermined information is life environment information related to a life of the user.

8. The presence-in-house determination system according to claim 6, wherein the predetermined information is residential environment information related to house environment of the house of the user.

9. The presence-in-house determination system according to claim 1, wherein the processor is further configured to determine whether the user is present in the house based on the first determination result, the second determination result, and a past determination result.

10. The presence-in-house determination system according to claim 1, wherein the third determination result is converted into a predetermined index value indicating a presence-in-house possibility of the user and is output.

11. The presence-in-house determination system according to claim 10, wherein the third determination result is output in association with at least one of life environment information related to a life of the user or residential environment information related to house environment of the house of the user for the predetermined index value calculated for the user.

12. The presence-in-house determination system according to claim 1, wherein when a presence-in-house possibility of the user determined by the processor according to the first determination result is within a predetermined range, the processor determines whether the user is present in the house based on the first determination result and the second determination result.

13. The presence-in-house determination system according to claim 3, wherein another appliance includes a constantly operating appliance configured to operate constantly, and the processor is further configured to whether the user is present in the house based on a weighting parameter corresponding to an operation state of the constantly operating appliance.

14. A presence-in-house determination method for determining whether a user is present in a house by using a computer, the presence-in-house determination method comprising:

by the computer, setting a weighting parameter larger as a presence-in-house possibility of the user is higher for at least one electric appliance of the house of the user;

by the computer, determining whether the user is present in the house based on a change over time in electric power consumption of the house of the user, and outputting as a first presence-in-house determination result;

by the computer, determining whether the user is present in the house based on the weighting parameter of the at least one electric appliance of the house, and outputting as a second presence-in-house determination result; and by the computer, determining whether the user is present in the house based on the first presence-in-house determination result and the second presence-in-house determination result and outputting a determination result for each region set on a map by statistically processing a change over time in a presence-in-house possibility of each user that exists in the region.

* * * * *